(12) United States Patent
Kawamura

(10) Patent No.: US 8,264,013 B2
(45) Date of Patent: Sep. 11, 2012

(54) SOLID-STATE IMAGE CAPTURING DEVICE AND ELECTRONIC INFORMATION DEVICE

(75) Inventor: Tomohiko Kawamura, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 631 days.

(21) Appl. No.: 12/069,930

(22) Filed: Feb. 14, 2008

(65) Prior Publication Data

US 2008/0210984 A1   Sep. 4, 2008

(30) Foreign Application Priority Data

Feb. 16, 2007   (JP) .................. 2007-036948

(51) Int. Cl.
*H01L 27/148* (2006.01)

(52) U.S. Cl. ............ 257/231; 257/183.1; 257/184; 257/233; 257/461; 257/462; 257/465; 257/E31.053; 257/E31.067; 257/E31.084; 438/57; 438/60; 438/75; 250/208.1

(58) Field of Classification Search .......... 257/231, 257/233, 183.1, 184–186, 192, 461–466, 257/E31.053, E31.057, E31.067, E31.084; 438/57, 60, 75; 250/208.1
See application file for complete search history.

(56) References Cited

U.S. PATENT DOCUMENTS

| 7,060,960 B2 | 6/2006 | Ohta et al. |
| 7,187,023 B2 | 3/2007 | Yoshihara |
| 7,300,810 B2 | 11/2007 | Yoshihara |
| 2006/0124977 A1* | 6/2006 | Shinohara et al. ............ 257/292 |
| 2006/0284274 A1* | 12/2006 | Lee et al. .................. 257/431 |
| 2007/0029463 A1* | 2/2007 | Park et al. ............... 250/208.1 |

FOREIGN PATENT DOCUMENTS

| JP | 2003-289137 | 10/2003 |
| JP | 2006-303328 | 11/2006 |
| JP | 2007-335673 | 12/2007 |
| KR | 2003-0060601 | 7/2003 |

OTHER PUBLICATIONS

Korean Official Action in Korean Application No. 10-2008-0013415 corresponding to above-identified US Application.

* cited by examiner

*Primary Examiner* — Julio J Maldonado
*Assistant Examiner* — Maria Ligai
(74) *Attorney, Agent, or Firm* — Edwards Wildman Palmer LLP; David G. Conlin; David A. Tucker

(57) ABSTRACT

A device separation insulating film and a device separation semiconductor layer are provided for a device separation section for separating adjacent devices from each other, end portions of the device separation insulating film and end portions of the device separation semiconductor layer are provided to overlap each other in order to surround two sides of an outer-periphery of the voltage conversion section and also to surround a channel section of the charge transfer device and the light receiving devices and an end portion of the device separation insulating film facing an end face of the light receiving device is arranged inwardly below a control electrode with respect to an end face of the control electrode on the light receiving device side.

75 Claims, 11 Drawing Sheets

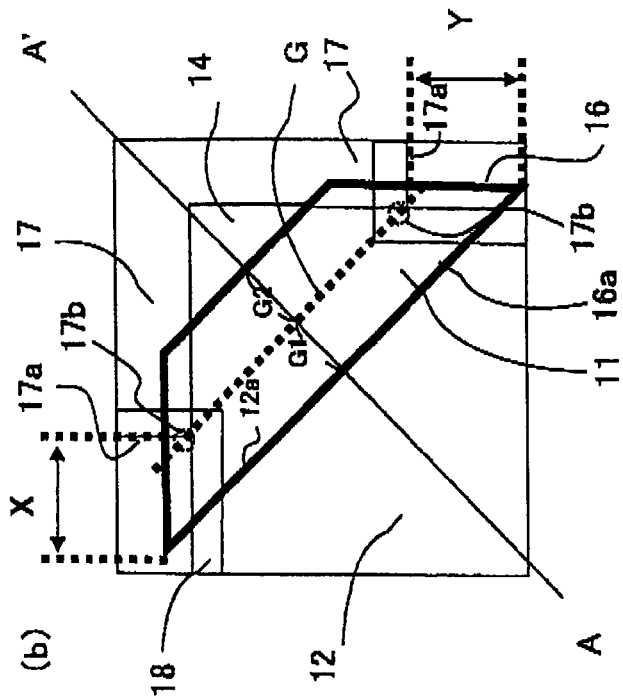
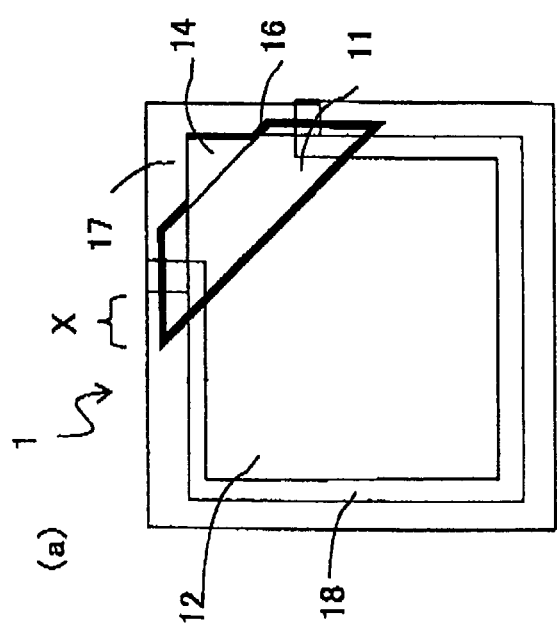
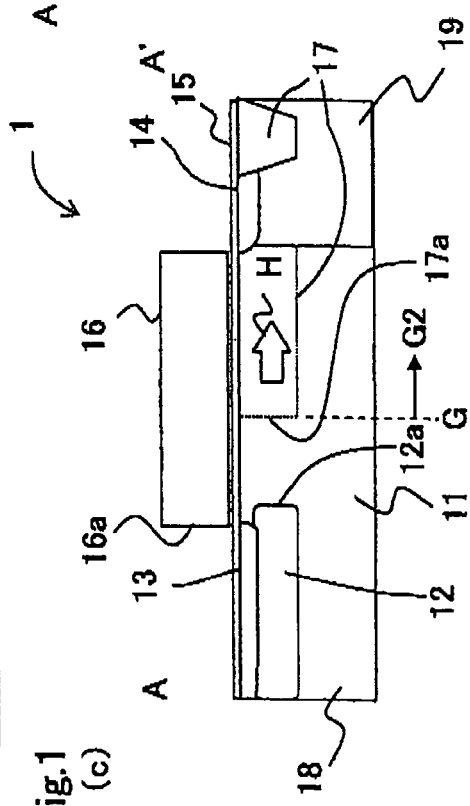
Fig.1

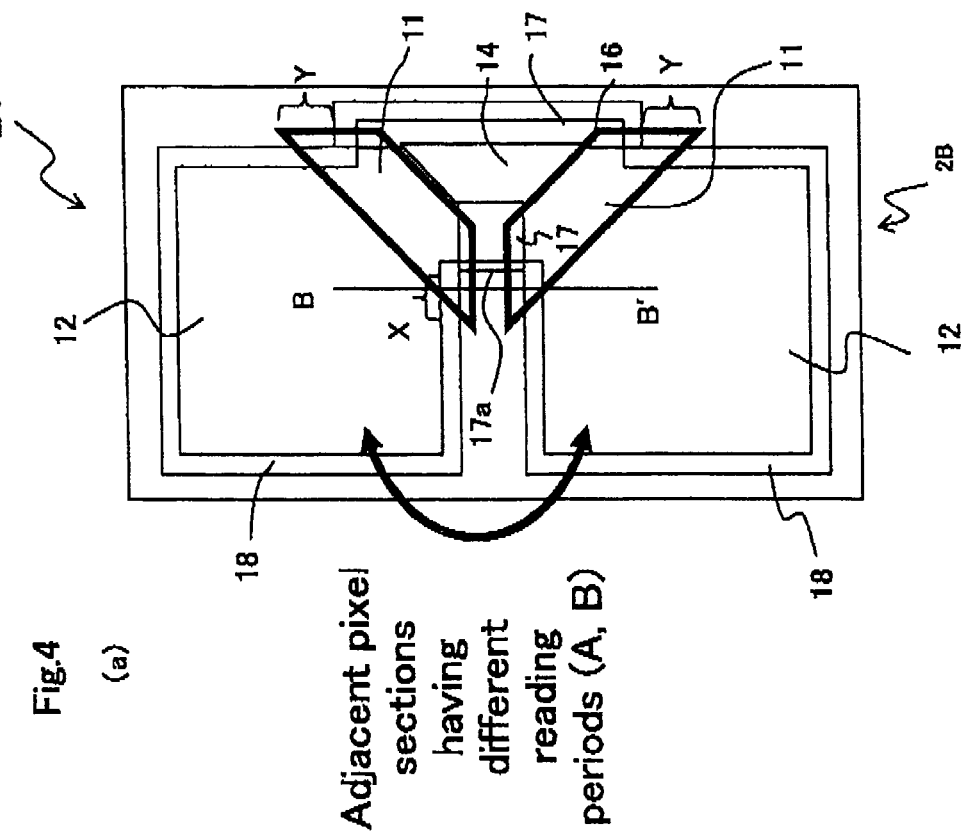
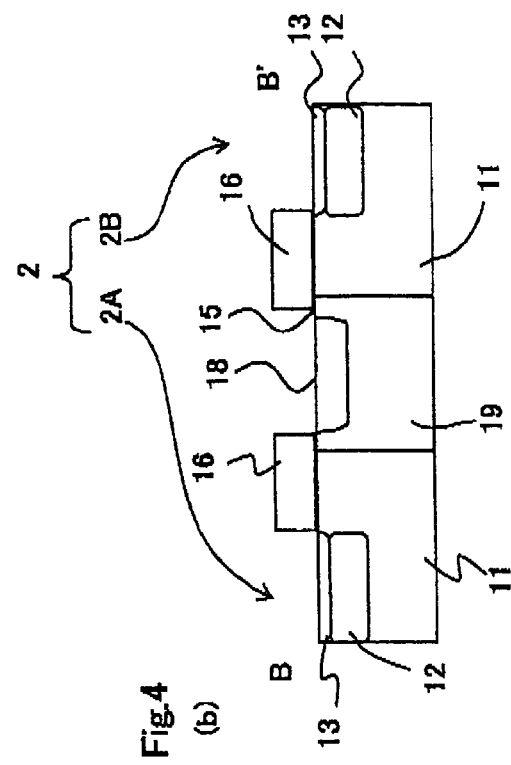
Fig.4 (a)
Fig.4 (b)

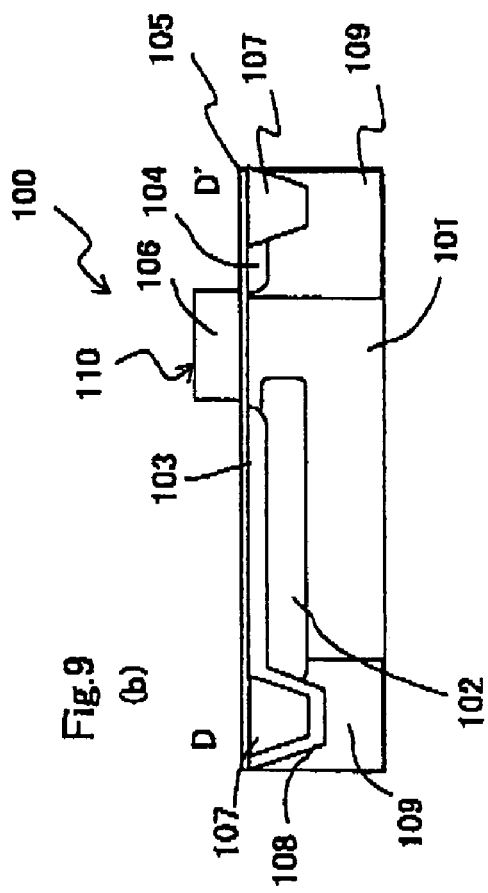
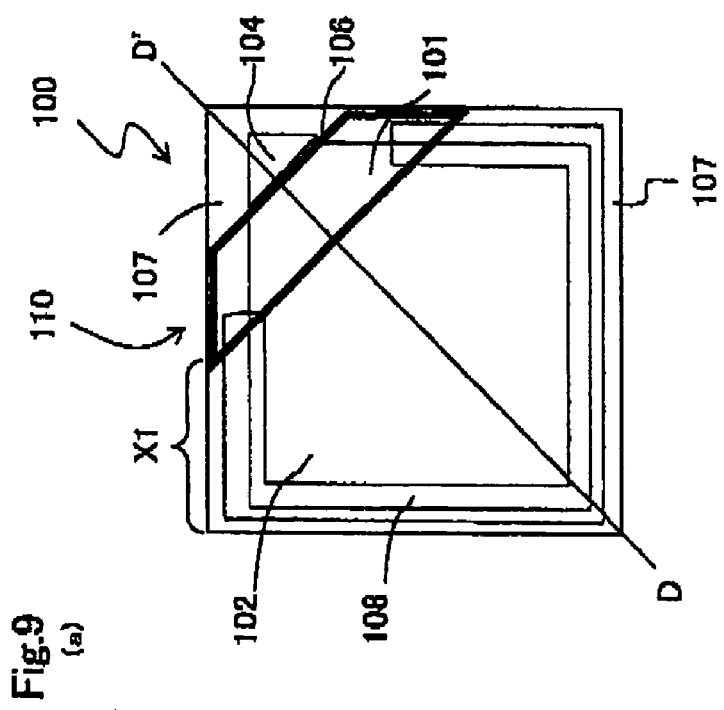

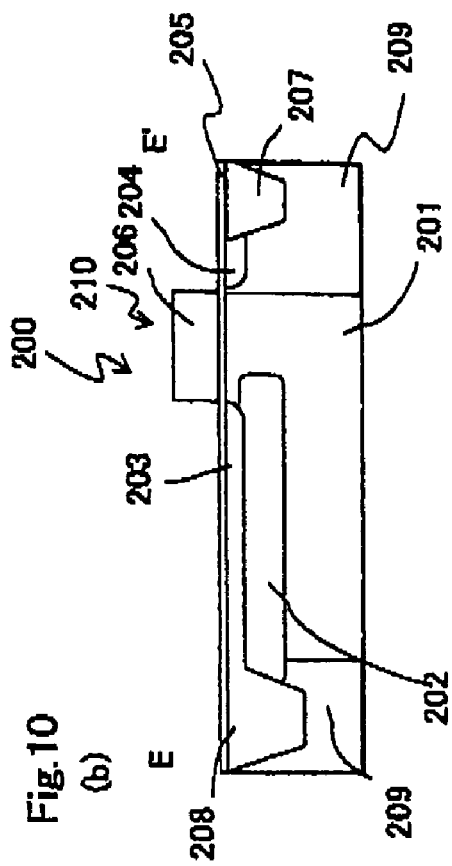
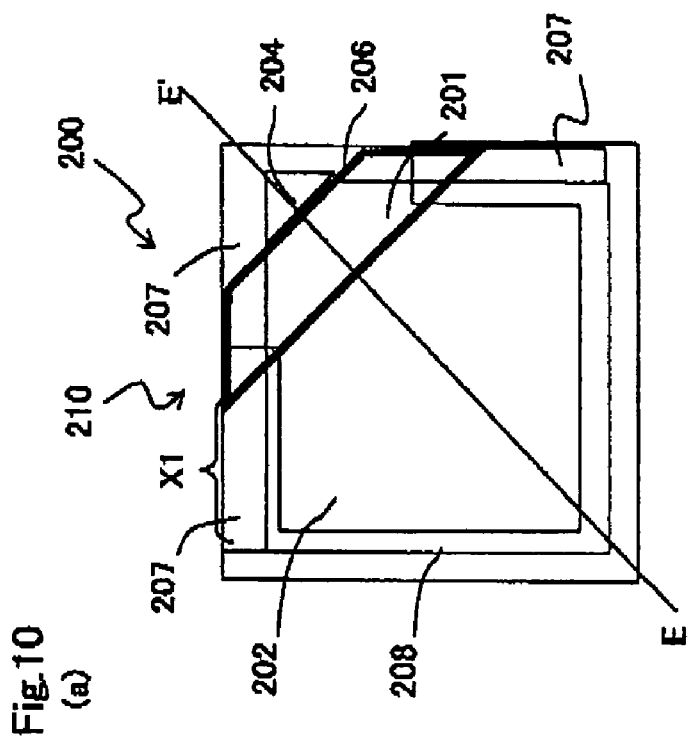
Fig. 10 (a)
Fig. 10 (b)

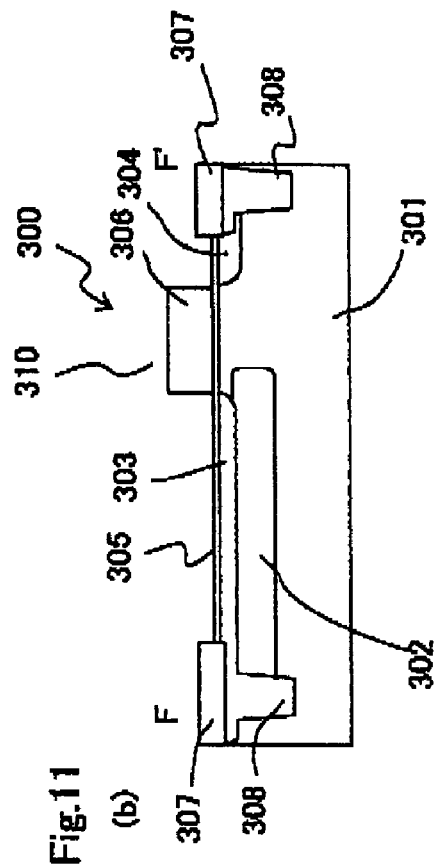
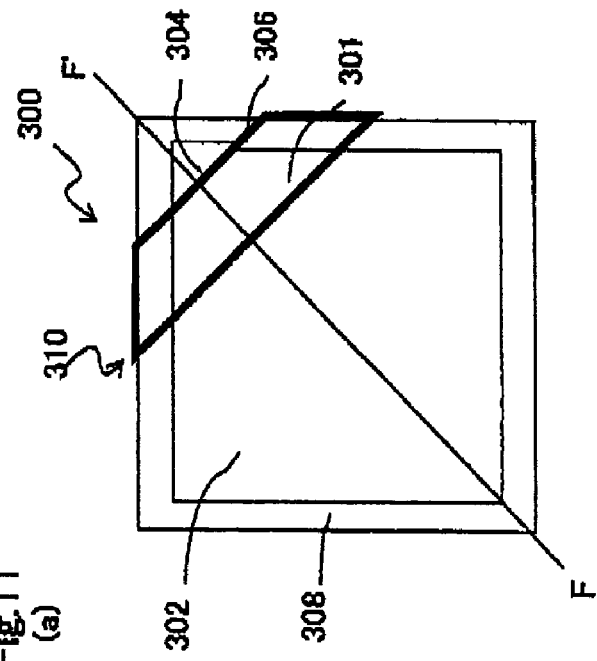
Fig.11

SOLID-STATE IMAGE CAPTURING DEVICE AND ELECTRONIC INFORMATION DEVICE

This Nonprovisional application claims priority under 35 U.S.C. §119(a) on Patent Application No. 2007-036948 filed in Japan on Feb. 16, 2007, the entire contents of which are hereby incorporated by reference.

BACKGROUND OF THE INVENTION

1. Field of the Invention

The present invention relates to: a solid-state image capturing device (e.g., MOS image sensor) for transferring, to a voltage conversion section, signal charge obtained by a photoelectrical conversion at a photodiode that functions as a light receiving section for receiving light of a subject and sequentially reading a signal corresponding to a voltage obtained by a conversion at the voltage conversion section; and an electronic information device (e.g., digital camera, cell phone device equipped with camera and the like) using the solid-state image capturing device for an image capturing section thereof.

2. Description of the Related Art

Recently, a MOS (Metal Oxide Semiconductor) image sensor using a MOS has begun to be widely used as a conventional solid-state image capturing device, along with a CCD (Charge Coupled Device) image sensor. The reason for this is because it is possible, for example, to manufacture the MOS image sensor using a conventional IC (Integrated Circuit) manufacturing technique, and it is also possible to miniaturize the MOS image sensor and to improve the speed thereof by mounting a peripheral circuit for driving the MOS image sensor on the same chip. In addition, the MOS image sensor has an advantage compared to the CCD image sensor that it does not require a high drive voltage, and the structure thereof is simple.

Different from the CCD image sensor, each pixel section in the MOS image sensor requires: a photodiode that functions as a light receiving section for receiving light of a subject; a voltage conversion section for converting signal charge from the photodiode to a signal voltage; and a plurality of transistors that form a signal reading circuit, in order to read a signal from the photodiode. More specifically, for a plurality of transistors, for example, a commonly-used MOS image sensor requires: a charge transfer transistor for transferring signal charge from a photodiode to a voltage conversion section; a reset transistor for resetting the signal charge accumulated at the voltage conversion section prior to the signal charge transfer; an amplification transistor for amplifying and reading the signal charge accumulated at the voltage conversion section as a signal; and a selection transistor for selecting a pixel section to be read and outputting the signal amplified by the amplification transistor to a signal line. Accordingly, each pixel section requires: a photodiode; a voltage conversion section; and four transistors. Hence, this makes the reduction of a pixel section size difficult. As such, proposals have been recently made to suppress the characteristic deterioration that results from the reduction of a pixel section size by reducing the number of transistors for each pixel by employing a structure in which a voltage conversion section is shared by a plurality of pixel sections, a structure in which a circuit drive is performed without a selection transistor or the like.

For a device separation layer for separating transistors and photodiodes in each unit (e.g., in each pixel section), LOCOS (Local Oxidation of Silicon) is used. Further, with a recent advanced miniaturization, STI (Shallow Trench Isolation) is now commonly used for a device separation layer.

The commonly-used MOS image sensor described above forms an embedded photodiode structure by providing a surface diffusion layer at the top surface of a photodiode in order to suppress the flow of unwanted current (dark current) that is generated at the interface between a silicon substrate and a silicon oxide film into the photodiode. However, there also exists a numeral number of defects at the interface between a device separation layer and the silicon substrate, and thus there is much signal charge to be generated as noise.

In order to suppress the flow of charge that is generated at the interface between the device separation layer and the silicon substrate into the photodiode, Reference 1 proposes, for example, a structure of a pixel section in which a high-concentration semiconductor layer having an opposite polarity of a photodiode (or having an opposite conductive type of source and drain regions of a transistor) is formed to surround the side surfaces and the bottom surface of a device separation section that is formed by STI, in order to prevent the diffusion of unwanted electrons to the photodiode. This will be described with reference to Portion (a) of FIG. 9 and Portion (b) of FIG. 9.

Portion (a) of FIG. 9 is a top view showing an exemplary structure of a pixel section 100 in a conventional solid-state image capturing device disclosed in Reference 1. Portion (b) of FIG. 9 is a longitudinal cross-sectional view of a portion cut by line D-D' in Portion (a) of FIG. 9.

As shown in Portion (a) of FIG. 9 and Portion (b) of FIG. 9, in the pixel section 100 in the conventional solid-state image capturing device, an n-type photodiode 102 having an n-type impurity implanted therein is formed at the top surface of a p-type semiconductor layer 101 and a p-type surface diffusion layer 103 is formed at the top surface of the photodiode 102 to form an embedded photodiode structure.

A transfer gate electrode 106 of a charge transfer transistor 110 is provided on the p-type semiconductor layer 101, which is between the photodiode 102 and a voltage conversion section 104, via a gate insulating film 105 made from a silicon oxide film.

A device separation insulating film 107 that is formed by STI is provided around the periphery of the pixel section 100 to separate adjacent photodiodes 102 from each other. On the D side of the portion cut by line D-D', a p-type surface diffusion layer 108 is provided to surround the side surfaces and the bottom surface of the device separation insulating film 107. A p-type diffusion layer 109 is provided below the p-type surface diffusion layer 108 at a location deeper than the device separation insulating film 107. In this manner, by surrounding the side surfaces and the bottom surface of the device separation insulating film 107 with the p-type surface diffusion layer 108, leak current is prevented from flowing from the device separation insulating film 107 into the photodiode 102.

In addition, on the D' side of the portion cut by line D-D', the p-type diffusion layer 109 is provided at a location deeper than the device separation insulating film 107 to surround the side surfaces and the bottom surface of each of the device separation insulating film 107 and the voltage conversion section 104.

In addition, Reference 2 proposes, for example, an implantation separation structure in which a device separation section for separating adjacent photodiodes (or a device separation section for separating transistors) from each other is formed as an impurity-implanted diffusion layer, and an amount of surfaces of a device separation insulating film and a photodiode that face each other is reduced. Compared to the case where the device separation insulating film 107 that is formed by STI is provided around the periphery (around the four sides) of the photodiode 102 and the device separation insulating film 107 is surrounded by the semiconductor layer as shown in Reference 1 in Portion (a) of FIG. 9 and Portion (b) of FIG. 9, in the case of Reference 2, the device separation insulating film that is formed by STI is provided around the two sides of the photodiode on the charge transfer transistor side, the device separation insulating film is surrounded by a semiconductor layer, and the other two sides of the photodiode between adjacent photodiodes are only separated by employing an implantation separation structure. As a result, dark current can be reduced by a reduced amount of the device separation insulating film formed by STI. This will be described with reference to Portion (a) of FIG. 10 and Portion (b) of FIG. 10.

Portion (a) of FIG. 10 is a top view showing an exemplary structure of a pixel section 200 in a conventional solid-state image capturing device disclosed in Reference 2. Portion (b) of FIG. 10 is a longitudinal cross-sectional view of a portion cut by line E-E' in Portion (a) of FIG. 10.

As shown in Portion (a) of FIG. 10 and Portion (b) of FIG. 10, in the pixel section 200 in the conventional solid-state image capturing device, an n-type photodiode 202 having an n-type impurity implanted therein is formed at the top surface of a p-type semiconductor layer 201 and a p-type surface diffusion layer 203 is formed at the top surface of the photodiode 202 to form an embedded photodiode structure, as in the case shown in FIG. 9.

A transfer gate electrode 206 of a charge transfer transistor 210 is provided on the p-type semiconductor layer 201, which is between the photodiode 202 and a voltage conversion section 204, via a gate insulating film 205 made from a silicon oxide film.

On the E' side of the portion cut by line E-E', a device separation insulating film 207 that is formed by STI is provided around the periphery of the pixel section 200 to separate adjacent photodiodes 202 from each other, and a p-type diffusion layer 209 is provided at a location deeper than the device separation insulating film 207 to surround the side surfaces and the bottom surface of each of the device separation insulating film 207 and the voltage conversion section 204.

On the E side of the portion cut by line E-E', a p-type surface diffusion layer 208 having an impurity implanted and diffused therein is provided around the periphery of the pixel section 200 to separate adjacent photodiodes 202 from each other. The p-type diffusion layer 209 is provided at a location deeper than the p-type surface diffusion layer 208 to surround the side surfaces and the bottom surface of the p-type surface diffusion layer 208. In this manner, by forming the device separation section with the p-type surface diffusion layer 208, a stress upon a substrate by the device separation insulating film 207 that is formed by STI is reduced, and thus leak current can be suppressed.

Further, Reference 3 proposes, for example, a structure in which a thick oxide film is formed on a silicon substrate, and an impurity diffusion layer is provided below the oxide film for device separation to prevent the generation of dark current without employing LOCOS or STI for device separation. This will be described with reference to Portion (a) of FIG. 11 and Portion (b) of FIG. 11.

Portion (a) of FIG. 11 is a top view showing an exemplary structure of a pixel section 300 in a conventional solid-state image capturing device disclosed in Reference 3. Portion (b) of FIG. 11 is a longitudinal cross-sectional view of a portion cut by line F-F' in Portion (a) of FIG. 11.

As shown in Portion (a) of FIG. 11 and Portion (b) of FIG. 11, in the pixel section 300 in the conventional solid-state image capturing device, an n-type photodiode 302 having an n-type impurity implanted therein is formed at the top surface of a p-type semiconductor layer 301 and a p-type surface diffusion layer 303 is formed at the top surface of the photodiode 302 to form an embedded photodiode structure, as in the cases shown in FIG. 9 and FIG. 10.

A transfer gate electrode 306 of a charge transfer transistor 310 is provided on the p-type semiconductor layer 301, which is between the photodiode 302 and a voltage conversion section 304, via a gate insulating film 305 made from a silicon oxide film. A thick insulating film 307 is provided around the periphery of the pixel section 300 on a silicon substrate to separate adjacent photodiodes 302 from each other. A p-type surface diffusion layer 308 having an impurity implanted therein is provided below the insulating film 307. In this manner, by forming the device separation section with the p-type surface diffusion layer 308 and the thick insulating film 307, the insulating layer (i.e., the thick insulating film 307) is not embedded at a deep location in the substrate, and the occurrence of crystal defect or damage on the semiconductor substrate around the device separation section, or the generation of interface state on the semiconductor substrate around the device separation section is suppressed. As such, noise resulting therefrom can be reduced.

In addition, since the four sides of the photodiode 302 are surrounded by the thick insulating film 307 and the transfer gate electrode 306 is provided on the insulating film 307, the p-type semiconductor layer 301 and the transfer gate electrode 306 are separated by the thickness of the insulating film 307. Thus, charge is less likely to flow into an adjacent photodiode 302 of a neighboring pixel section via the transfer gate electrode 306 (cross talk). In this case, the transfer gate electrode 306 is provided on the top surface of the p-type semiconductor layer 301 via a thin gate insulating film 305.

Reference 1: Japanese Laid-Open Publication No. 2004-253729

Reference 2: Japanese Laid-Open Publication No. 2002-270808

Reference 3: Japanese Laid-Open Publication No. 2005-347325

SUMMARY OF THE INVENTION

However, in Reference 2, although the implantation separation semiconductor layer having an opposite polarity of the photodiode 202 is formed to surround the device separation insulating film 207 that is formed by STI, an amount of surfaces of the device separation insulating film 207 and the photodiode 202 that face each other is large since the device separation insulating film 207 has the same length as one side of the periphery of the photodiode 202. Therefore, unwanted charge generated at the interface between the device separation insulating film 207 and the silicon substrate penetrates, to some extent, through the implantation separation semiconductor layer and flows into the photodiode 202 side. In Reference 1, since the device separation insulating film 107 is provided around the periphery of the photodiode 102, the degree of unwanted charge from the device separation insulating film 107 into the photodiode 102 side is more significant than the case in Reference 2.

In addition, when device separation (implantation separation) is made only by the impurity diffusion layer as proposed in Reference 3, it is necessary to form a device separation section for a pixel region with a process that is different from the process that forms a device separation section for peripheral circuits. Thus, the steps become extremely complicated, and the cost for the processes becomes high. Further, since a difference occurs between the thick oxide film 307 formed on the silicon substrate and the thin oxide film (gate insulating film 305) of a channel section, this causes a concern of making the formation of the transfer gate electrode 306 difficult.

The present invention is intended to solve the conventional problems described above. The objective of the present invention is to provide: a solid-state image capturing device capable of reducing noise by suppressing the flow of charge generated from a device separation insulating film into a photodiode and also by suppressing the accumulation of the charge at the photodiode, without complicating the steps and without making the formation of a transfer gate electrode difficult; and an electronic information device (e.g., digital camera and the like) using the solid-state image capturing device for an image capturing section thereof.

A solid-state image capturing device according to the present invention is provided, in which a plurality of light receiving devices for each converting incident light to signal charge is arranged in two dimensions, the signal charge obtained by a conversion at a light receiving device is transferred to a voltage conversion section by a charge transfer device, and a signal amplified in accordance with a signal voltage obtained by a conversion at the voltage conversion section is read, wherein a device separation insulating film and a device separation semiconductor layer are provided for a device separation section for separating adjacent devices from each other, end portions of the device separation insulating film and end portions of the device separation semiconductor layer are provided to overlap each other in order to surround two sides of an outer-periphery of the voltage conversion section and also to surround a channel section of the charge transfer device and the light receiving device, and an end portion of the device separation insulating film facing an end face of the light receiving device is arranged inwardly below a control electrode with respect to an end face of the control electrode on the light receiving device side or an end portion of the device separation insulating film facing an end face of the light receiving device is arranged as an protruded portion that extends beyond a portion below the end face of the control electrode on the light receiving device side and protrudes along a side of a periphery of the light receiving device, thereby the objective described above being achieved.

A solid-state image capturing device according to the present invention is provided, in which a plurality of light receiving devices for each converting incident light to signal charge is arranged in two dimensions, the signal charge obtained by a conversion at a light receiving device is transferred to a voltage conversion section by a charge transfer device, and a signal amplified in accordance with a signal voltage obtained by a conversion at the voltage conversion section is read, wherein a device separation insulating film and a device separation semiconductor layer are provided for a device separation section for separating adjacent devices from each other, end portions of the device separation insulating film and end portions of the device separation semiconductor layer are provided to overlap each other in order to surround two sides of an outer-periphery of the voltage conversion section and also to surround a channel section of the charge transfer device and the light receiving device, and an entire or partial device separation insulating film in its width direction, which extends along the two sides of the outer-periphery of the voltage conversion section, is provided under both ends of a control electrode of the charge transfer device or an entire or partial device separation insulating film in its width direction is provided as an protruded portion that extends along the two sides of the outer-periphery of the voltage conversion section, extends beyond portions below the ends at the control electrode and protrudes along the periphery of the light receiving device, thereby the objective described above being achieved.

Preferably, in a solid-state image capturing device according to the present invention, both ends of the control electrode of the charge transfer device is provided over an entire or partial width of each of the device separation insulating film and the device separation semiconductor layer.

Still preferably, in a solid-state image capturing device according to the present invention, a pixel section includes: the light receiving device and the charge transfer device, a corner portion of the pixel section that has a square shape or rectangular shape in a plane view remains such that the control electrode of the charge transfer transistor is provided in a slanted manner on adjacent sides at the corner portion of the pixel section that has a square shape or rectangular shape in a plane view, the light receiving device is provided in the pixel section except at the corner portion and a region of the control electrode, and the voltage conversion section is provided at the corner portion or a region including the corner portion.

Still preferably, in a solid-state image capturing device according to the present invention, two pixel sections are arranged such that corner portions thereof are adjacent to each other, the corner portions of the two pixel sections are coupled to each other in an integrated manner, a region where the corner portions are coupled to each other forms the single voltage conversion section, and the voltage conversion section is shared by the two pixel sections.

Still preferably, in a solid-state image capturing device according to the present invention, four pixel sections are arranged such that corner portions thereof are adjacent to each other, the corner portions of the four pixel sections are coupled to each other in an integrated manner, a region where the corner portions are coupled to each other forms the single voltage conversion section, and the voltage conversion section is shared by the four pixel sections.

Still preferably, in a solid-state image capturing device according to the present invention, four pixel sections are arranged in such a manner that corner portions thereof are adjacent to each other, corner portions of two pixel sections among the four pixel sections are coupled to corner portions of the other two pixel sections, respectively, in an integrated manner, one region and the other region where the corner portions of the two pixel sections are coupled to each other and the corner portions of the other two pixel sections are coupled to each other, respectively, form one voltage conversion section and the other voltage conversion section, respectively, the two pixel sections share the one voltage conversion section, the other two pixel sections share the other voltage conversion section, and device separation insulating films are provided between the one voltage conversion section and the other voltage conversion section.

Still preferably, in a solid-state image capturing device according to the present invention, the end portion of the device separation insulating film is at least located within a region where an electric field generated below the control electrode is generated in a direction from a portion below the control electrode to the voltage conversion section.

Still preferably, in a solid-state image capturing device according to the present invention, the device separation insulating film is formed to have a minimum size with maximum process utilization in view of a size of the device separation insulating film in the region.

Still preferably, in a solid-state image capturing device according to the present invention, the end portion of the device separation insulating film is at least located away from the end face of the light receiving device by a region where an electric field generated below the control electrode is generated in a direction from a portion below the control electrode to the light receiving device.

Still preferably, in a solid-state image capturing device according to the present invention, a protruded length of the protruded portion is a cut length of the control electrode that corresponds to a direction of one side of the light receiving device or shorter than the cut length.

Still preferably, in a solid-state image capturing device according to the present invention, a protruded length of the protruded portion is a width of the control electrode or shorter than the width.

Still preferably, in a solid-state image capturing device according to the present invention, a protruded length of the protruded portion is a width of the device separation insulating film or shorter than the width.

Still preferably, in a solid-state image capturing device according to the present invention, when a position of the end portion of the device separation insulating film that faces the end face of the light receiving device matches a position of the end face of the control electrode on the light receiving side in a plane view or the position of the end portion of the device separation insulating film that faces the end face of the light receiving device is located inwardly below the control electrode with respect to the end face of the control electrode on the light receiving device side, the protruded portion has a protruded length designated in view of a process margin or the protruded portion of the device separation insulating film protrudes shorter than the protruded length.

Still preferably, in a solid-state image capturing device according to the present invention, overlapping portions of the end face of the control electrode on the light receiving device side, and the device separation insulating film and the device separation semiconductor layer are obliquely-crossed, and the end portions of the device separation insulating film is located toward the control electrode side with respect to the positions of the respective end faces of the control electrode on the light receiving device side.

Still preferably, in a solid-state image capturing device according to the present invention, the device separation semiconductor layer is provided while the end portions of the device separation semiconductor layer are overlapped with the end portions of the device separation insulating film to surround side surfaces and a bottom surface of the device separation insulating film.

Still preferably, in a solid-state image capturing device according to the present invention, the device separation insulating film protrudes from a portion below the end face of the control electrode on the light receiving side, and the device separation semiconductor layer is provided while the end portions of the device separation semiconductor layer are overlapped with the end portions of the device separation insulating film to surround side surfaces and a bottom surface of a portion of the device separation insulating film below the control electrode, the portion including the protruded portion.

Still preferably, in a solid-state image capturing device according to the present invention, an portion in which the end portions of the device separation semiconductor layer and the end portions of the device separation insulating film are overlapped with each other includes at least a region where an electric field generated below the control electrode is generated in a direction from a portion below the control electrode to the light receiving device.

Still preferably, in a solid-state image capturing device according to the present invention, the end portions of the device separation semiconductor layer is overlapped with the end portions of the device separation insulating film while a width of the device separation semiconductor layer is larger than a width of the device separation insulating film.

Still preferably, in a solid-state image capturing device according to the present invention, the device separation semiconductor layer includes: a surface diffusion layer made from a semiconductor layer having an opposite conductive type to the light receiving device and the voltage conversion section; and a circumference diffusion layer that is made from a semiconductor layer having the same conductive type as the surface diffusion layer and that surrounds side surfaces and a bottom surface of the surface diffusion layer.

Still preferably, a solid-state image capturing device according to the present invention further includes a signal reading circuit for reading a signal corresponding to a signal voltage, the signal voltage being obtained by converting signal charge at the voltage conversion section, the signal charge being transferred from the light receiving device to the voltage conversion section.

Still preferably, in a solid-state image capturing device according to the present invention, the signal reading circuit is provided for each pixel section or the signal reading circuit is shared by a plurality of pixel sections.

Still preferably, in a solid-state image capturing device according to the present invention, among a reset transistor capable of resetting the voltage conversion section so as to have a predetermined voltage, an amplification transistor for outputting a signal corresponding to a signal voltage obtained by converting signal charge that has been transferred from the light receiving device to the voltage conversion section subsequent to the resetting, and a selection transistor for reading the output signal from the amplification transistor with a predetermined timing, the signal reading circuit includes at least the reset transistor and the amplification transistor.

Still preferably, in a solid-state image capturing device according to the present invention, the light receiving device is a photodiode, the control electrode of the charge transfer device is a transfer gate electrode of a charge transfer transistor.

Still preferably, in a solid-state image capturing device according to the present invention, the device separation section separates adjacent light receiving devices from each other, charge transfer devices from each other, and the light receiving device and the charge transfer device.

Still preferably, in a solid-state image capturing device according to the present invention, the device separation section device separates the light receiving device and the charge transfer device from component devices of the reading signal circuit, the light receiving device and the charge transfer device and the component device being adjacent to each other.

Still preferably, in a solid-state image capturing device according to the present invention, the device separation insulating film is formed by the same method with the same material and at the same time as a device separation insulating film for separating devices that form a drive circuit provided in a peripheral drive circuit region, the drive circuit driving the signal reading circuit and the charge transfer device.

Still preferably, in a solid-state image capturing device according to the present invention, the device separation insulating film is different from a device separation insulating film for separating devices that form a drive circuit provided in a peripheral drive circuit region, the device separation insulating film being formed exclusively for a pixel-section region to have a film thicker than the device separation insulating film for separating the devices that form the drive circuit, the drive circuit driving the signal reading circuit and the charge transfer device.

Still preferably, in a solid-state image capturing device according to the present invention, the device separation insulating film is an insulating film formed by LOCOS (Local Oxidation of Silicon) or STI (Shallow Trench Isolation).

Still preferably, in a solid-state image capturing device according to the present invention, a separation width of each of the surface diffusion layer and the circumference diffusion layer between the control electrode of the charge transfer device and a neighboring adjacent light receiving device is set to greater than or equal to 0.1 μm to less than or equal to 0.5 μm.

Still preferably, in a solid-state image capturing device according to the present invention, a separation width of each of the surface diffusion layer and the circumference diffusion layer between control electrodes of adjacent charge transfer devices is set to greater than or equal to 0.1 μm to less than or equal to 0.3 μm.

Still preferably, in a solid-state image capturing device according to the present invention, control electrodes of charge transfer devices are each separately formed for a shared voltage conversion section in adjacent pixel sections A and B in which charges thereof are transferred during different reading periods.

Still preferably, in a solid-state image capturing device according to the present invention, control electrodes of charge transfer devices are each separately formed for a shared voltage conversion section in adjacent pixel sections A, B, C and D in which charges thereof are transferred during different reading periods.

Still preferably, in a solid-state image capturing device according to the present invention, the control electrode of the charge transfer device is formed continuously over adjacent pixel sections A and A' in which charges thereof are transferred during the same reading period.

Still preferably, in a solid-state image capturing device according to the present invention, adjacent pixel sections A and A' are provided in which charges thereof are transferred during the same reading period, adjacent pixel sections B and B' are provided in which charges thereof are transferred during the same reading period that is different from that for the adjacent pixel sections A and A', the control electrode of the charge transfer device is commonly formed continuously over the adjacent pixel sections A and A' such that the charges thereof are transferred to different voltage conversion sections, and the control electrode of the charge transfer device that is different from that for the adjacent pixel sections A and A' is commonly formed continuously over the adjacent pixel sections B and B' such that the charges thereof are transferred to different voltage conversion sections.

Still preferably, in a solid-state image capturing device according to the present invention, an impurity for each of the surface diffusion layer and the circumference diffusion layer is implanted prior to the formation of the control electrode of the charge transfer device.

Still preferably, in a solid-state image capturing device according to the present invention, an impurity for the surface diffusion layer is implanted subsequent to the formation of the control electrode of the charge transfer device so as to penetrate the control electrode.

Still preferably, in a solid-state image capturing device according to the present invention, an impurity concentration of the surface diffusion layer is set higher than an impurity concentration of a semiconductor layer having the same conductive type provided below the control electrode of the charge transfer device.

Still preferably, in a solid-state image capturing device according to the present invention, an impurity for a semiconductor layer forming the light receiving device is implanted prior to the formation of the control electrode of the charge transfer device.

Still preferably, in a solid-state image capturing device according to the present invention, the light receiving device and the control electrode of the charge transfer device are overlapped with each other in a plane view to have an overlapping portion.

Still preferably, in a solid-state image capturing device according to the present invention, an impurity for a semiconductor layer forming the light receiving device is implanted subsequent to the formation of the control electrode of the charge transfer device.

Still preferably, in a solid-state image capturing device according to the present invention, the light receiving device is formed resulting from the self-alignment with respect to the control electrode of the charge transfer device.

Still preferably, in a solid-state image capturing device according to the present invention, when charge is transferred from the light receiving device to the voltage conversion section, a potential at the surface diffusion layer between the light receiving device and the voltage conversion section below the control electrode of the charge transfer device is set higher than a potential at a semiconductor layer having the same conductive type provided below the control electrode of the charge transfer device.

Still preferably, in a solid-state image capturing device according to the present invention, the end portion of the device separation insulating film is at least located within a region where an electric field generated below the control electrode is generated in a direction from a portion below the end face of the control electrode on the light receiving device side to the voltage conversion section.

Still preferably, in a solid-state image capturing device according to the present invention, a maximum of a potential at the electric field generated below the control electrode is located directly under the end face of the control electrode on the light receiving device side.

An electronic information device according to the present invention uses the solid-state image capturing device according to the present invention described above for an image capturing section thereof.

Hereinafter, the functions of the present invention having the structures described above will be described.

According to the present invention, an end portion of the device separation insulating film facing an end face of the light receiving device is arranged inwardly below a control electrode with respect to an end face of the control electrode on the light receiving device side or an end portion of the device separation insulating film facing an end face of the light receiving device is arranged as an protruded portion that extends beyond a portion below the end face of the control electrode on the light receiving device side and protrudes along a side of a periphery of the light receiving device. Alternatively, an entire or partial device separation insulating film in its width direction, which extends along the two sides of the outer-periphery of the voltage conversion section, is provided under both ends of a control electrode of the charge transfer device or an entire or partial device separation insulating film in its width direction is provided as an protruded portion that extends along the two sides of the outer-periphery of the voltage conversion section, extends beyond portions below the ends at the control electrode and protrudes along the periphery of the light receiving device. As a result, without complicating the steps and without making the formation of the transfer gate electrode difficult as required in Reference 3, it is possible to significantly prevent the flow of unwanted charge generated at the interface between the device separation insulating film and the silicon substrate into the light receiving device side, compared to the conventional structures (References 1 and 2) in which the device separation insulating film is provided around the periphery of the light receiving device.

Herein, the problems of References 1 and 2 will be further described.

In a method for forming an implantation separation semiconductor layer having an opposite polarity of the photodiode 102 to surround the device separation insulating film 107 that is formed by STI as proposed in Reference 1, it is possible to prevent noise due to the charge that is generated from the device separation insulating film 107 (component other than the transfer gate electrode 106). However, there is a problem that the implantation separation semiconductor layer having a high concentration cannot be formed below the transfer gate electrode 106 due to the deterioration in the charge transfer.

In addition, also in a method for making a device separation (implantation separation), for example, separating photodiodes 102 from each other by an implantation diffusion layer as proposed in Reference 2, it is not possible to prevent noise due to the charge generated from the device separation insulating film 207 that is present below the transfer gate electrode 206, since the device separation insulating film 207 formed by STI is provided to separate charge transfer transistors 210 from each other.

In order to solve the problems described above, according to the present invention, the end portion of the device separation insulating film is at least located within a region where the electric field generated below the control electrode of the charge transfer device is generated in a direction from a portion below the control electrode to the voltage conversion section. Alternatively, the end portion of the device separation insulating film is at least located away from the end face of the light receiving device by a region where the electric field generated below the control electrode is generated in a direction from a portion below the control electrode to the light receiving device.

Further detailed description will be given. In a device separation section for separating adjacent devices from each other, the end portions of the device separation insulating film and the end portions of the device separation semiconductor layer are provided to overlap each other in order to surround the sides of the outer-periphery of the voltage conversion section and also to surround the channel section of the charge transfer device and the light receiving device. Adjacent photodiodes (and/or transistors) among a plurality of photodiodes (light receiving device) arranged in two dimensional arrays are separated from each other by the device separation insulating film and the device separation semiconductor layer while the end portions of the device separation insulating film and the end portions of the device separation semiconductor layer are connected to each other. The device separation semiconductor layer includes: a surface diffusion layer made from an implantation separation semiconductor layer having an opposite conductive type to the photodiode; and a circumference diffusion layer that is made from a semiconductor layer having the same conductive type as the surface diffusion layer and that is formed at a location deeper than the bottom surface of the device separation insulating film to cover the side surfaces of the device separation insulating film.

The end portion of the device separation insulating film is formed below the transfer gate electrode that functions as the control electrode of the charge transfer transistor functioning as the charge transfer device, and the end portion of the device separation insulating film extends from the opposite side of the photodiode. The end position (end portion or end face) of the device separation insulating film that is present below the transfer gate electrode of the charge transfer transistor is located inwardly below the transfer gate electrode with respect to the end face of the photodiode from the end face of the transfer gate electrode on the photodiode side. Therefore, by the same device separation section as that for peripheral circuits (signal reading circuit and drive circuit for driving the signal reading circuit), it is possible to separate the photodiode and the voltage conversion section that is made from a semiconductor layer having the same polarity (same conductive type) as the photodiode. In addition, an amount of surfaces of the device separation insulating film and the photodiode that face each other is significantly reduced, compared to the conventional technique. Further, even if unwanted charge is generated at the device separation insulating film that is present below the transfer gate electrode of the charge transfer transistor, it is possible to reduce noise since unwanted charge is less likely to be accumulated at the photodiode, as long as the direction of the electric field is toward the voltage conversion section side. Further, also in the structure in which a single voltage conversion section is shared by pixel sections, it is possible to reduce to the greatest extent the amount of surfaces of the photodiode and the device separation insulating film that face each other by reducing the surface-area size of the device separation insulating film that is present below the transfer gate electrode of the charge transfer transistor.

As described above, according to the present invention, an entire or partial device separation insulating film in its width direction, which extends along the two sides of the outer-periphery of the voltage conversion section, is provided under both ends of a control electrode of the charge transfer device (both ends of the device separation insulating film are located under both ends of the control electrode of the charge transfer device, respectively) or an entire or partial device separation insulating film in its width direction is provided as an protruded portion that extends along the two sides of the outer-periphery of the voltage conversion section, extends beyond portions below the ends at the control electrode and protrudes along the periphery of the light receiving device. As a result, without complicating the steps and without making the formation of the transfer gate electrode difficult as happens conventionally, it is possible to significantly prevent the flow of unwanted charge generated at the interface between the device separation insulating film and the silicon substrate into the light receiving device side, compared to the conventional structures in which the device separation insulating film is provided around the periphery of the light receiving device.

Further, even if unwanted charge is generated at the device separation insulating film that is present below the control electrode of the charge transfer transistor, it is possible to reduce noise since the unwanted charge is less likely to be accumulated at the light receiving device, as long as the direction of the electric field is toward the voltage conversion section side. Further, if a predetermined amount of distance between the end face of the control electrode on the light receiving device side and the device separation insulating film is secured, it is possible to provide a structure in which the light receiving device and the control electrode are overlapped with each other in a plane view, and thus it is possible to prevent the dark current and to improve the efficiency in the charge transfer. In addition, it is possible to enlarge the region size of the light receiving device and to increase a saturation charge amount. Further, also in the structure in which a single voltage conversion section is shared by pixel sections, it is possible to reduce to the greatest extent the amount of surfaces of the light receiving device and the device separation insulating film that face each other by reducing the surface-area size of the device separation insulating film that is present below the control electrode. As a result, it is possible to further suppress noise.

These and other advantages of the present invention will become apparent to those skilled in the art upon reading and understanding the following detailed description with reference to the accompanying figures.

BRIEF DESCRIPTION OF THE DRAWINGS

Portion (a) of FIG. 1 is a top view showing an exemplary structure of a pixel section in a solid-state image capturing device according to Embodiment 1 of the present invention; Portion (b) of FIG. 1 is a partial enlarged view of Portion (a) of FIG. 1; and Portion (c) of FIG. 1 is a longitudinal cross-sectional view of a portion cut by line A-A' in Portion (b) of FIG. 1.

Portion (a) of FIG. 4 is a top view showing an exemplary structure of pixel sections in a solid-state image capturing device according to Embodiment 2 of the present invention; and Portion (b) of FIG. 4 is a longitudinal cross-sectional view of a portion cut by line B-B' in Portion (a) of FIG. 4.

Figure 5:
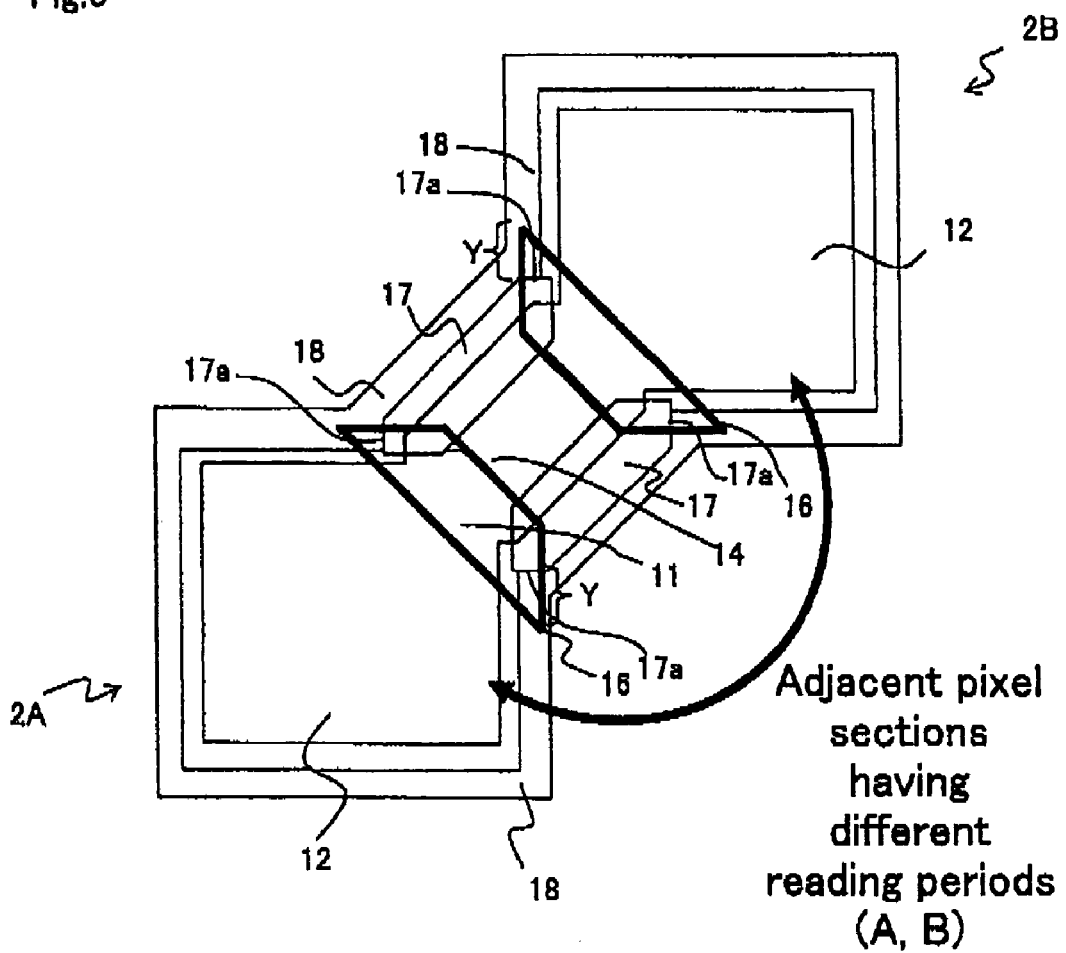

FIG. 5 is a top view showing an exemplary structure of pixel sections in another solid-state image capturing device according to Embodiment 2 of the present invention.

Figure 6:
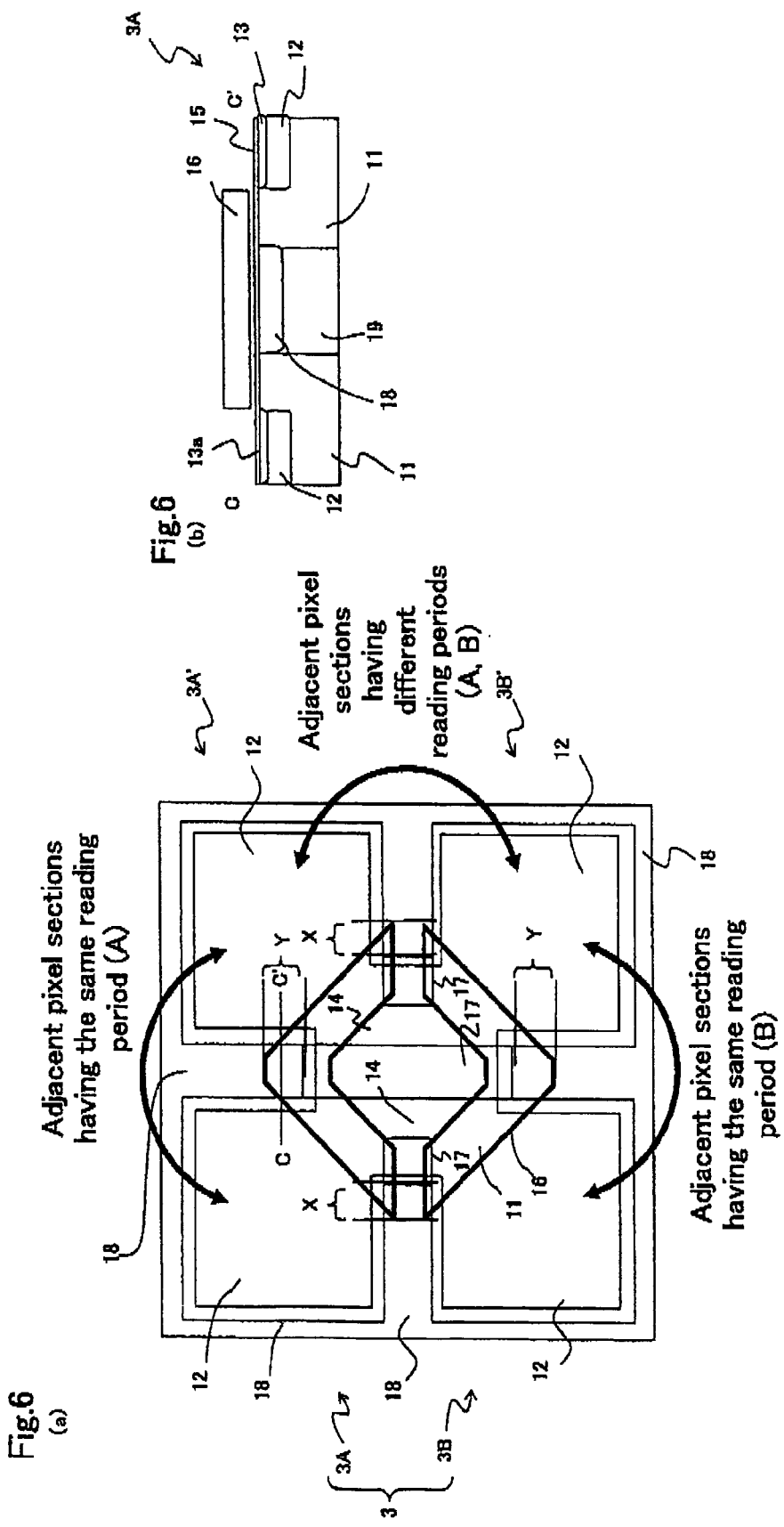

Portion (a) of FIG. 6 is a top view showing an exemplary structure of pixel sections in a solid-state image capturing device according to Embodiment 3 of the present invention; and Portion (b) of FIG. 6 is a longitudinal cross-sectional view of a portion cut by line C-C' in Portion (a) of FIG. 6.

Figure 7:
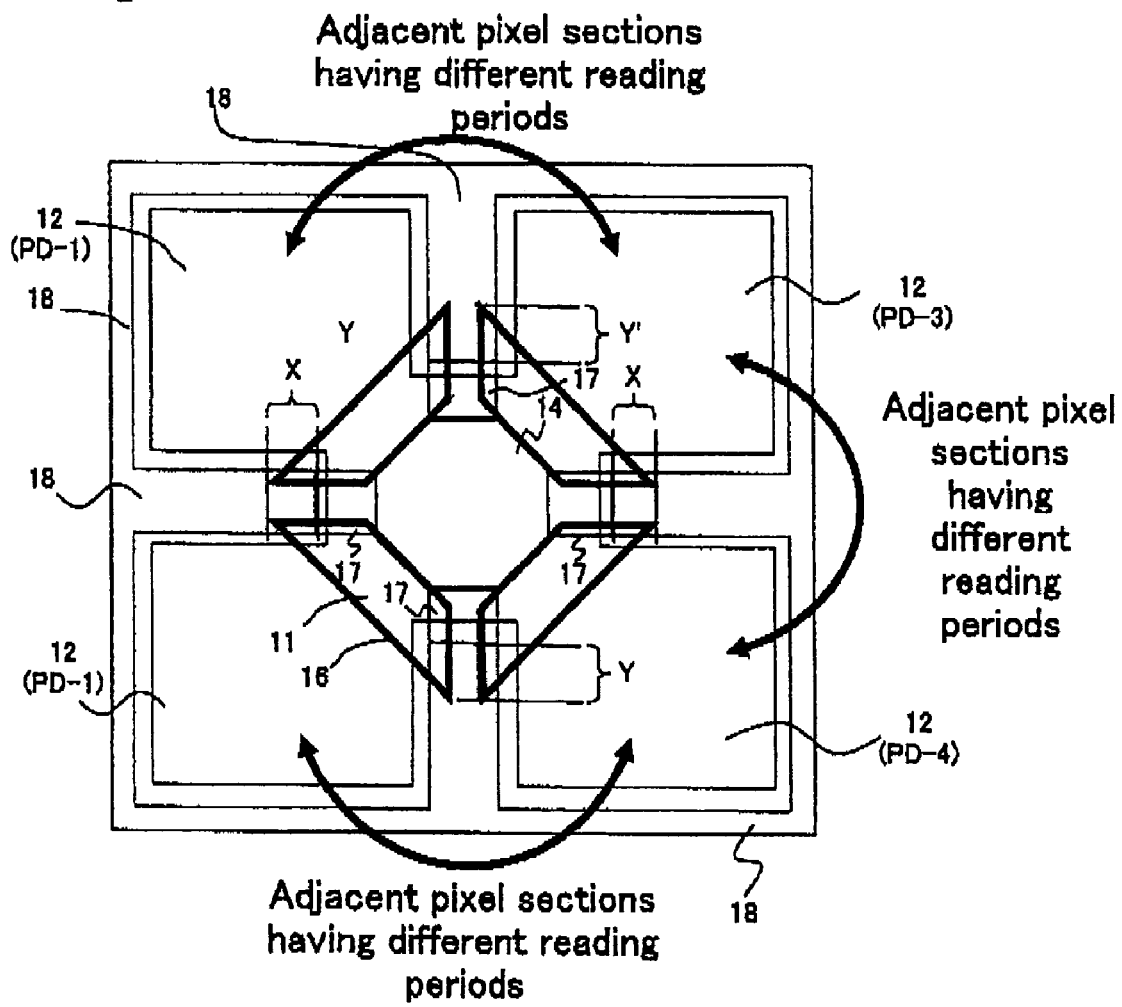

FIG. 7 is a top view showing an exemplary structure of pixel sections in a solid-state image capturing device according to Embodiment 5 of the present invention.

Figure 8:
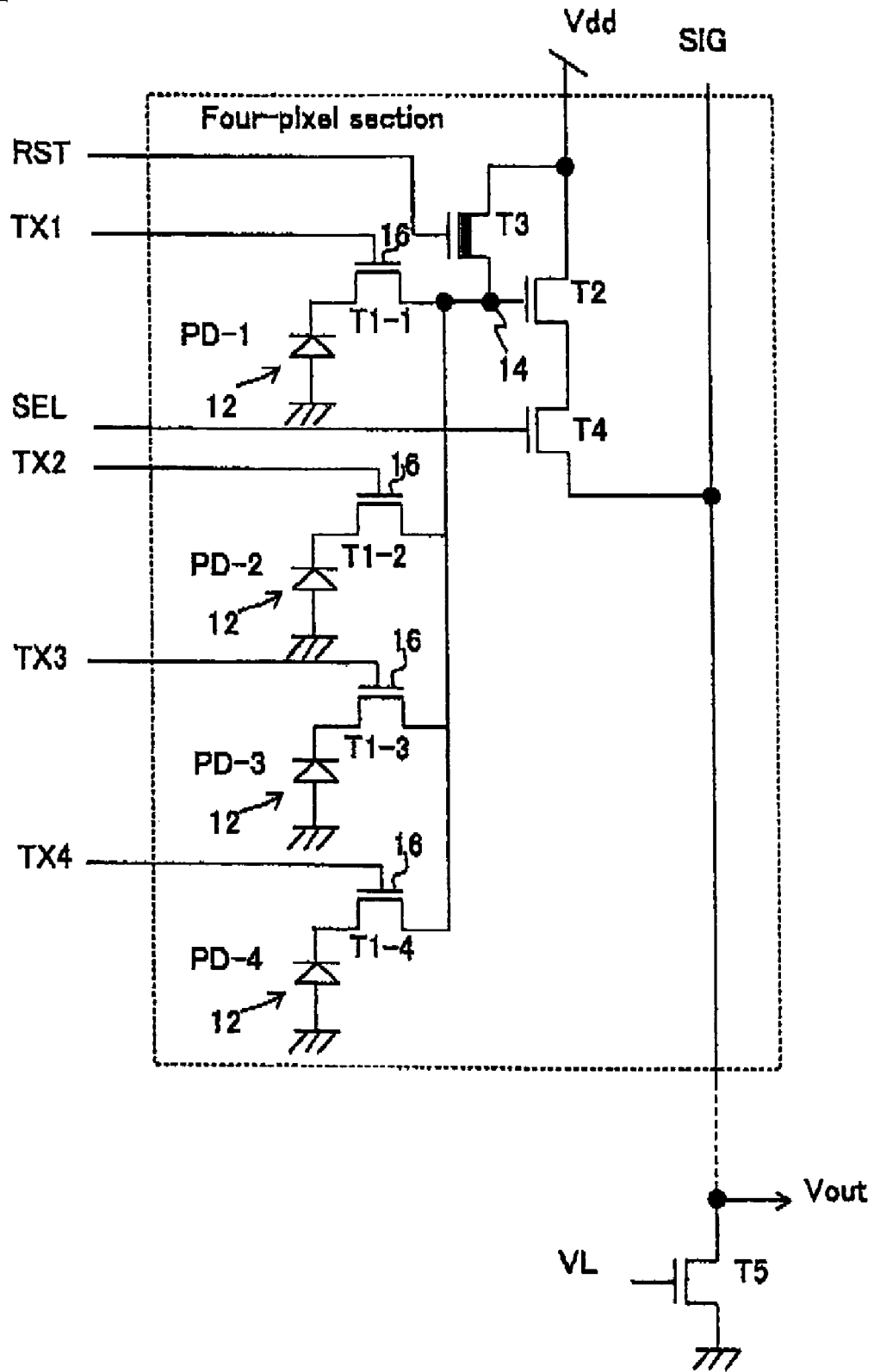

FIG. 8 is a circuit diagram showing an exemplary essential structure of a solid-state image capturing device according to the present invention used for an electronic information device according to Embodiment 5 of the present invention when a single voltage conversion section is shared by four pixel sections.

Portion (a) of FIG. 9 is a top view showing an exemplary structure of a pixel section in a conventional solid-state image capturing device disclosed in Reference 1; and Portion (b) of FIG. 9 is a longitudinal cross-sectional view of a portion cut by line D-D' in Portion (a) of FIG. 9.

Portion (a) of FIG. 10 is a top view showing an exemplary structure of a pixel section in a conventional solid-state image capturing device disclosed in Reference 2; and Portion (b) of FIG. 10 is a longitudinal cross-sectional view of a portion cut by line E-E' in Portion (a) of FIG. 10.

Portion (a) of FIG. 11 is a top view showing an exemplary structure of a pixel section in a conventional solid-state image capturing device disclosed in Reference 3; and Portion (b) of FIG. 11 is a longitudinal cross-sectional view of a portion cut by line F-F' in Portion (a) of FIG. 11.

Figure 12:
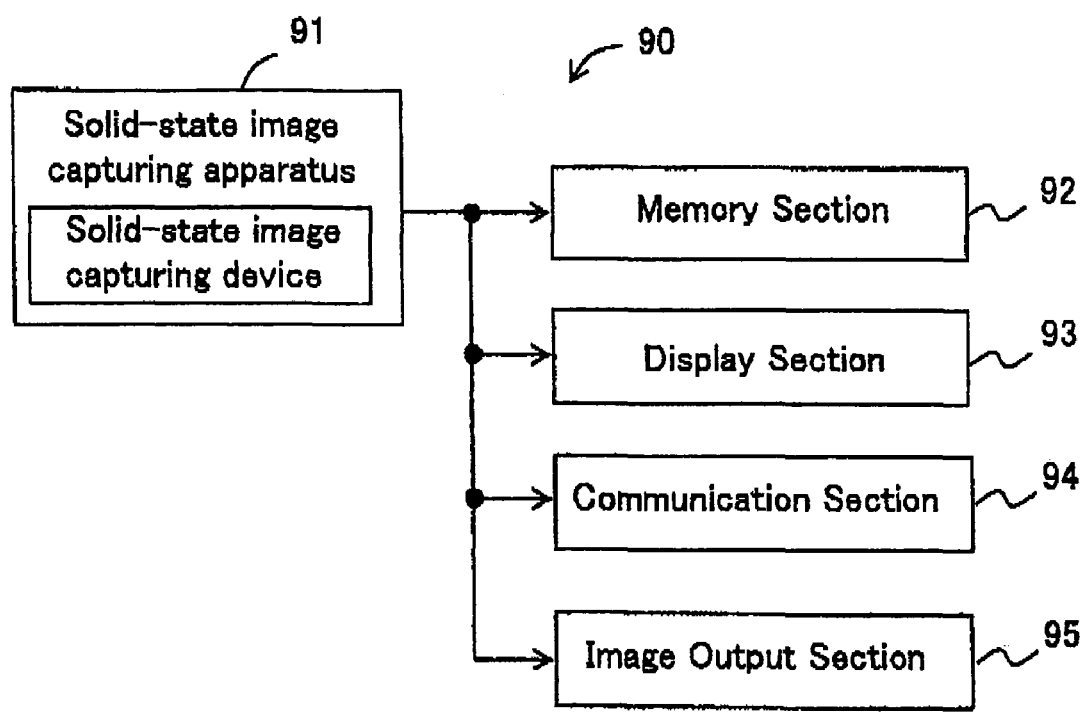

FIG. 12 is a block diagram showing an exemplary schematic structure of an electronic information device according to Embodiment 5 of the present invention using a solid-state image capturing apparatus including a solid-state image capturing device according to any one of Embodiments 1 to 3 for an image capturing section thereof.

1 to 3, 2A, 2B, 3A, 3B, 3A', 3B' pixel section
11 semiconductor layer below the transfer gate electrode
12, PD-1 to PD-4 photodiode
12a end face
13 photodiode surface diffusion layer
14 voltage conversion section
16 transfer gate electrode
16a end face
17 device separation insulating film
17a end portion (end face)
17b end portion facing the end face of the photodiode
18 surface diffusion layer
19 circumference diffusion layer
90 electronic information device
91 solid-state image capturing apparatus
92 memory section
93 display section
94 communication section
95 image output section
G end position of the device separation insulating film
G1 region below the transfer gate electrode where the potential is decreased toward the photodiode side
G2 region below the transfer gate electrode where the potential is decreased toward the voltage conversion section side
T1-1 to T1-4 transfer transistor
T2 amplification transistor
T3 reset transistor
T4 selection transistor
T5 load transistor

DESCRIPTION OF THE PREFERRED EMBODIMENTS

Hereinafter, Embodiments 1 to 4 of a solid-state image capturing device according to the present invention, and Embodiment 5 of an electronic information device using the solid-state image capturing device for an image capturing section thereof will be described in detail with reference to the accompanying drawings.

Embodiment 1

Embodiment 1 describes a case in which one voltage conversion section that functions as a signal charge detection section makes a pair with one pixel section, the voltage conversion section is not shared by a plurality of pixel sections, a device separation insulation film is formed by STI, a photodiode is made from an n-type semiconductor layer, and a transfer gate electrode of a charge transfer transistor is arranged in a slanted manner with respect to the arrangement of the photodiode. It should be noted that the device separation insulating film formed by STI can be formed to operate a pixel-section region by the same method with the same material as that for a device separation insulating film for separating transistors that form a drive circuit (not shown) provided in a peripheral circuit region. Alternatively, the device separation insulating film formed by STI can be formed to have a thick film exclusively for the pixel-section region, wherein a film thickness thereof is different from that for a device separation insulating film that is provided in the peripheral circuit region. LOCOS (Local Oxidation of Silicon), STI (Shallow Trench Isolation), a thick insulating film formed on a silicon substrate or the like can be used as the device separation insulating film exclusively for the pixel-section region. Further, in FIG. 1, for the convenience of a simplified layout, transistors (signal reading circuit) such as a reset transistor, amplification transistor, selection transistor and the like that are provided for each of the pixel sections in order to read a signal are not shown. An example thereof will be described later with reference to FIG. 8. In actuality, transistors, other than the charge transfer transistor, are each also surrounded and separated by a device separation insulating film formed by STI. The layout of a pixel section is designed in such a manner that a plurality of pixel sections arranged in two dimensional arrays (in a matrix) is provided in a uniform manner.

Portion (a) of FIG. 1 is a top view showing an exemplary structure of a pixel section 1 in a solid-state image capturing device according to Embodiment 1 of the present invention. Portion (b) of FIG. 1 is a partial enlarged view of Portion (a) of FIG. 1. Portion (c) of FIG. 1 is a longitudinal cross-sectional view of a portion cut by line A-A' in Portion (b) of FIG. 1.

As shown in Portion (a) of FIG. 1 to Portion (c) of FIG. 1, the pixel section 1 in the solid-state image capturing device according to Embodiment 1 includes: a photodiode 12 that functions as a light receiving device; and a charge transfer transistor that functions as a charge transfer device. A corner portion of the pixel section 1 that has a square shape or rectangular shape in a plane view remains such that a transfer gate electrode 16 that functions as a control electrode of the charge transfer transistor is provided in a slanted manner on adjacent sides at the corner portion of the pixel section 1 that has a square shape or rectangular shape in a plane view. The photodiode 12 is provided in the pixel section 1 except at the corner portion and the region of the transfer gate electrode 16. A voltage conversion section 14 is provided at the corner portion. Both ends of the transfer gate electrode 16 of the charge transfer transistor in its longitudinal direction are provided over the entire or partial width (in this case, partial width) of a device separation insulating film 17 and a device separation semiconductor layer (surface diffusion layer 18 and circumference diffusion layer 19).

The n-type photodiode 12 having an n-type impurity implanted therein, which functions as a light receiving section, is formed at the top surface of a p-type semiconductor layer 11 and a p-type surface diffusion layer 13 is provided at the top surface of the photodiode 12 to form an embedded photodiode structure.

The photodiode 12 receives incident light from a subject and photoelectrically converts the incident light to signal charge. Although not shown here, a plurality of photodiodes 12 is provided in an image capturing region in two dimensional arrays.

The transfer gate electrode 16 of the charge transfer transistor is provided on the p-type semiconductor layer 11, which is between the photodiode 12 and the voltage conversion section 14, via a gate insulating film 15 made from a silicon oxide film. With the charge transfer transistor, the signal charge, which photoelectrically converted at the photodiode 12 when light of a subject is received, is transferred to the voltage conversion section 14 via the p-type semiconductor layer 11 below the transfer gate electrode 16. A signal corresponding to the signal voltage obtained by a conversion at the voltage conversion section 14 is amplified by an amplification transistor (not shown) and selected by a selection transistor (not shown) to read the signal to a signal line.

The voltage conversion section 14 is made from an n-type semiconductor layer having the same conductive type (polarity) as the photodiode 12. The voltage conversion section 14 converts the signal charge, which photoelectrically converted at the photodiode 12 when light of a subject is received, to a signal voltage.

The following are formed as a device separation section: the device separation insulating film 17 that is provided to separate photodiodes 12 from each other and transistors from each other and that surrounds the voltage conversion section 14 and extends and stops below the gate electrode 16; the surface diffusion layer 18 that is made from a p-type semiconductor layer having an opposite conductive type to each of the photodiode 12 and the voltage conversion section 14 and that surrounds the photodiode 12 while the end portions of the surface diffusion layer 18 are overlapped with the end portions of the device separation insulating film 17; and the circumference diffusion layer 19 made from a p-type semiconductor layer having the same conductive type as the surface diffusion layer 18. In the device separation section the end portions of the device separation insulation film 17 and the end portions of the device separation semiconductor layer (surface diffusion layer 18 and circumference diffusion layer 19) are provided and overlapped with each other to surround the outer-periphery of the voltage conversion section 14 and also to surround the channel portion of the charge transfer transistor and the photodiode 12.

On the A' side of the portion cut by line A-A', the device separation insulating film 17 formed by STI is provided around a portion of the periphery of the pixel section 1 to separate pixel sections from each other. The p-type diffusion layer 19 is provided at a location deeper than the device separation insulating film 17 to surround and cover the side surfaces and the bottom surface of each of the device separation insulating film 17 and the voltage conversion section 14. In addition, the p-type surface diffusion layer 18 having an impurity implanted and diffused therein is provided on the A side of the portion cut by line A-A' to separate adjacent photodiodes 12 from each other and to surround the photodiode 12 in a plane view. Although not shown here, the p-type diffusion layer 19 is provided to surround and cover the side surfaces and the bottom surface of the p-type surface diffusion layer 18. Photodiodes 12 are separated by the surface diffusion layer 18 and the p-type diffusion layer 19, wherein the surface diffusion layer 18 is formed to surround itself except at a portion (p-type semiconductor layer 11; a portion in contact with the channel section) that is in contact with the transfer gate electrode 16 via the gate insulation film 15, and the p-type diffusion layer 19 is provided at a location deeper than the device separation insulating film 17 formed by STI to cover the device separation insulating film 17.

Compared to the exemplary conventional structure of the pixel section shown in Portion (a) of FIG. 10, in the structure of the pixel section 1 according to Embodiment 1 shown in Portion (b) of FIG. 1, an end portion 17a of the device separation insulating film 17 is formed to extend and stop below the transfer gate electrode 16. The end position G of the device separation insulating film 17 that is present below the transfer gate electrode 16 is located inwardly below the transfer gate electrode 16 with respect to the photodiode 12 by distance G1 from an end face 16a of the transfer gate electrode 16 on the photodiode 12 side. In other words, the device separation insulating film 17 does not extend beyond the end face 16a of the transfer gate electrode 16 on the photodiode 12 side nor does it protrude into the photodiode 12. From a portion below the transfer gate electrode 16 to the photo diode 12 side, the surface diffusion layer 18 is formed to overlap with the end portion 17a of the device separation insulating film 17, and the p-type diffusion layer 19 is formed below the device separation insulating film 17 for device separation.

Herein, the conventional technique will be briefly described again. As shown in the exemplary conventional structure of the pixel section shown in Portion (a) of FIG. 10, in the case where there is a region X1 where the device separation insulating film 207 extends beyond the end face of the transfer gate electrode 206 to have the same length as one side of the periphery of the photodiode 202, the interface of the STI accordingly faces the photodiode 202. This causes a problem of flowing unwanted charge generated at the interface of the STI into the photodiode 202 side, thus resulting in the generation of noise. In addition, as shown in the exemplary conventional structure of the pixel section shown in Portion (a) of FIG. 10, in the case where there is the region X1 where the device separation insulating film 207 extends beyond the end face of the transfer gate electrode 206 to have the same length as one side of the periphery of the photodiode 202, even if the side surfaces and the bottom surface of the device separation insulating film 207 are surrounded by the p-type layers 208 and 209 each having an opposite polarity of the photodiode 202, the deterioration in the charge transfer still occurs below the transfer gate electrode 206. Thus, it is not possible to form a p-type diffusion layer having a high impurity concentration. Therefore, it is difficult to prevent the flow of charge generated at the interface of the STI, which is on the photodiode 202 side and which is near the end face of the transfer gate electrode 206, into the photodiode 202 side.

Therefore, in Embodiment 1, as shown in Portion (c) of FIG. 1, the end position G of the device separation insulating film 17 is located inwardly below the transfer gate electrode 16 with respect to the end face 16a of the transfer gate electrode 16 on the photodiode 12 side such that the device separation insulating film 17 below the transfer gate electrode 16 is located away from the end face 12a of the photodiode 12, for example, by distance G1. As such, even if charge is generated at the interface between the device separation insulating film 17 formed by STI and the silicon substrate, it is possible to suppress the flow of unwanted charge into the photodiode 12 side. However, in the case where the transfer gate electrode 16 and the device separation insulating film 17 are arranged to have such a positional relationship, it is preferable that a separation width of each of the surface diffusion layer 18 and the circumference diffusion layer 19 between the transfer gate electrode 16 and a neighboring adjacent photodiode 12 is sufficiently secured, for example, with greater than or equal to 0.1 μm to less than or equal to 0.5 μm, in order to prevent the flow of charge from one of adjacent photodiodes 12 into the other photodiode (neighboring adjacent photodiode) 12 (cross talk). It is preferable that the width of the device separation insulating film 17 formed by STI is greater than or equal to 0.1 μm to less than or equal to 0.5 μm, more preferably, greater than or equal to 0.1 μm to less than or equal to 0.3 μm, in view of a process margin.

It is preferable that an impurity is implanted to form the surface diffusion layer 18 subsequent to the formation of the transfer gate electrode 16, since a diffusion amount of the impurity due to unwanted heat becomes small.

Figure 2:
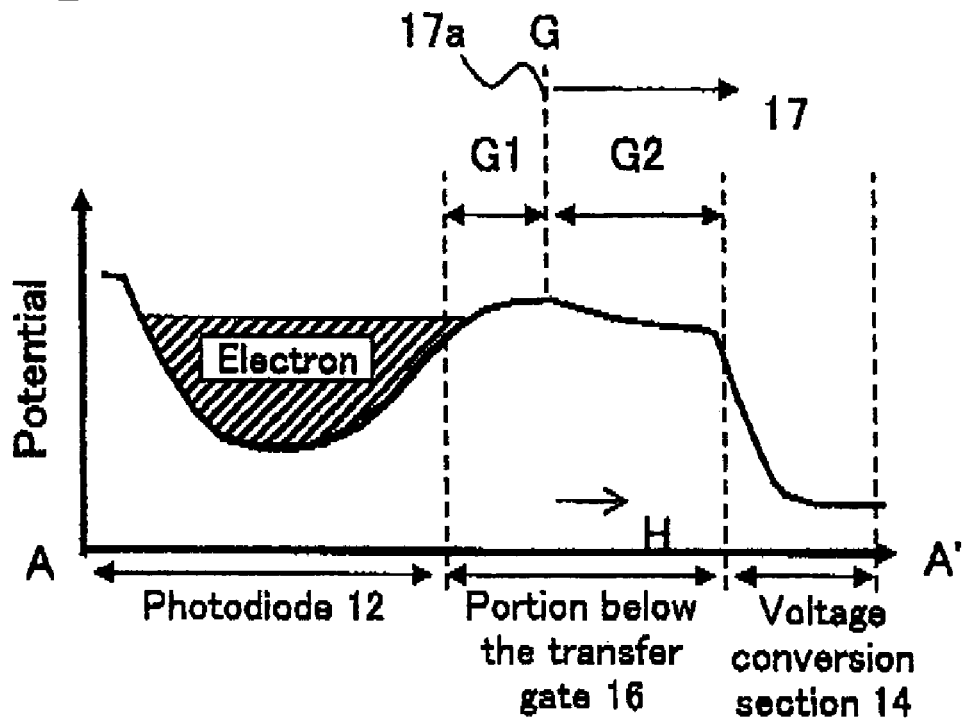
FIG. 2 is a graph showing a potential in the portion cut by line A-A' in Portion (b) of FIG. 1.

In the exemplary structure of the pixel section 10 shown in Portion (b) of FIG. 1, it is preferable that the end position G of the end face 17a of the device separation insulating film 17 located inwardly below the transfer gate electrode 16 with respect to the end face 16a of the transfer gate electrode 16 on the photodiode 12 side is located within a region G2 where the potential present below the transfer gate electrode 16 at the time of charge accumulation at the pixel section 1 decreases from the end position G to the voltage conversion section 14 side in a potential graph in the portion cut by line A-A' in Portion (b) of FIG. 1, as shown in FIG. 2. This is because, in the region G2, an electric field H to be generated between the photodiode 12 side and the voltage conversion section 14 side is generated in a direction from the photodiode 12 side to the voltage conversion section 14 side. Accordingly, unwanted charge generated at the interface between the STI and the silicon substrate at the time of charge accumulation flows into the voltage conversion section 14, and thus the flow of unwanted charge into the photodiode 12 is prevented. It should be noted that the end face 17a of the device separation insulating film 17 only has to be located in a region on the voltage conversion section 14 side with respect to the maximum (top of the mountain; position G) in the potential graph.

The impurity implantation for forming the photodiode 12 is performed subsequent to the formation of the transfer gate electrode 16, in order to ease the transfer of charge that is accumulated at the photodiode 12. As shown in the exemplary structure of the pixel section 1 shown in Portion (c) of FIG. 1, it is preferable that the positions of the end faces of the photodiode 12 and the transfer gate electrode 16 are approximately aligned by forming the photodiode 12 resulting from the self-alignment with respect to the transfer gate electrode 16 and the impurity concentration of the p-type semiconductor layer 11 below the transfer gate electrode 16 is diluted. The term "self-alignment" referred to herein refers to implanting an impurity using the transfer gate electrode 16 as a part of a mask and forming the photodiode 12. As a merit of such a self-alignment, even if the misalignment of the transfer gate electrode 16, the ununiform width of the device separation insulating film 17 or the ununiform separation width of each of the surface diffusion layer 18 and the circumference diffusion layer 19 occurs, it is possible to assuredly form the end face 16a of the transfer gate electrode 16 at the maximum (top of the mountain; position G) in the potential graph shown in FIG. 2. In other words, it is preferable that the maximum (top of the mountain; position G) in the potential graph is formed at a location directly under the end face 16a of the transfer gate electrode 16. As such, it is possible to prevent the charge not only from the device separation insulating film 17 (STI) but also from the interface of the silicon oxide film of the gate oxide film 15 and the silicon substrate. As shown in the potential graph shown in FIG. 2, it is preferable that the maximum (top of the mountain; position G) in the potential graph is located toward the end face 16a of the transfer gate electrode 16 with respect to the center of a portion below the transfer gate electrode 16, and most preferably, the maximum (top of the mountain; position G) in the potential graph is located right under the end face 16a of the transfer gate electrode 16. In this case, the end portion 17a of the device separation insulating film 17 that extends from the voltage conversion section 14 side is at least located within a region where the electric field to be generated below the transfer gate electrode 16 is generated in a direction from a portion below the end face 16a of the transfer gate electrode 16 on the photodiode 12 side to the voltage conversion section 14 side.

Figure 3:
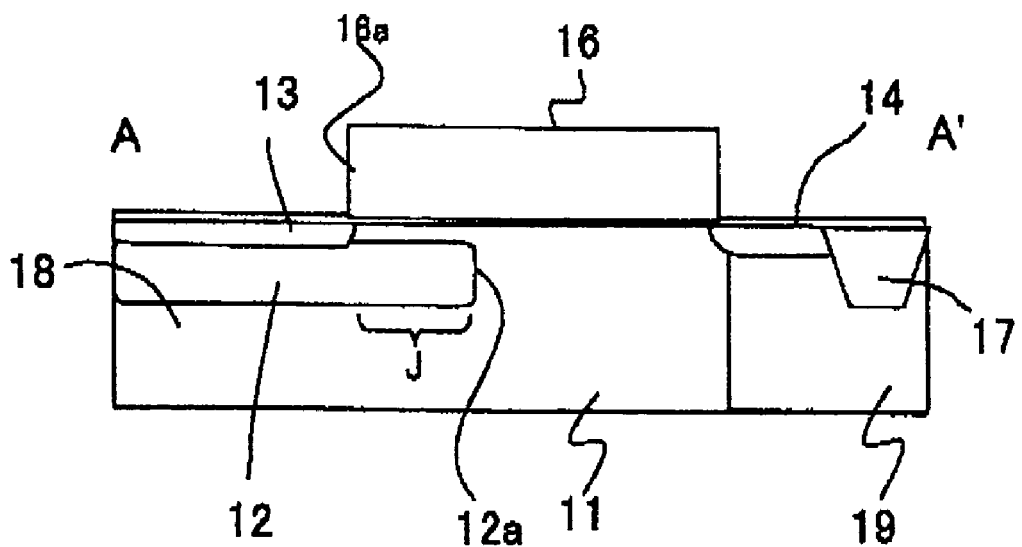
FIG. 3 is a longitudinal cross-sectional view showing an exemplary structure of a pixel section in another solid-state image capturing device according to Embodiment 1 of the present invention, cut by line A-A' in Portion (b) of FIG. 1.

Embodiment 1 has described that an impurity may be implanted to form the photodiode 12 subsequent to the formation of the transfer gate electrode 16. However, the present invention is not limited to this. As another example, as shown in FIG. 3, a step of implanting an impurity to form the photodiode 12 is performed prior to a step of forming the transfer gate electrode 16 to provide an overlapping portion J of the photodiode 12 with respect to the transfer gate electrode 16. In other words, the end face 12a of the photodiode 12 is located toward the voltage conversion section 14 side (located inwardly below the transfer gate electrode 16) with respect to the end face 16a of the transfer gate electrode 16. Thus, it is possible to transfer the charge accumulated at the photodiode 12 in an easier manner. The overlapping portion J can be easily adjusted. Also in this structure, since a predetermined distance G1 is provided between the end face 17a of the device separation insulating film 17 and the end face 12a of the photodiode 12 below the transfer gate electrode 16, it is possible to widen the margin with respect to the characteristic deterioration due to the misalignment that occurs when the photodiode 12 is formed.

Embodiment 2

Embodiment 2 describes an example of the present invention applied to a case in which a single voltage conversion section is shared by adjacent pixel sections, for which signals are read during different reading periods (with different reading timings) A and B.

Portion (a) of FIG. 4 is a top view showing an exemplary structure of pixel sections 2A and 2B in a solid-state image capturing device according to Embodiment 2 of the present invention. Portion (b) of FIG. 4 is a longitudinal cross-sectional view of a portion cut by line B-B' in Portion (a) of FIG. 4. In Portion (a) of FIG. 4 and Portion (b) of FIG. 4, the members obtaining a similar effect to that of the members shown in Portion (a) of FIG. 1 to Portion (a) of FIG. 1 are denoted with the same reference numerals. The values of X and Y may be the same to each other (X=Y) or different from each other (X≠Y).

As shown in Portion (a) of FIG. 4 and Portion (b) of FIG. 4, the pixel section 2A (or 2B) in the solid-state image capturing device according to Embodiment 2 includes: a photodiode 12 that functions as a light receiving device; and a charge transfer transistor that functions as a charge transfer device. A corner portion of the pixel section 2A that has a square shape or rectangular shape in a plane view remains such that a transfer gate electrode 16 that functions as a control electrode of the charge transfer transistor is provided in a slanted manner on adjacent sides at the corner portion of the pixel section 2A that has a square shape or rectangular shape in a plane view. The photodiode 12 is provided in the pixel section 2A except at the corner portion and the region of the transfer gate electrode 16. A voltage conversion section 14 is provided at a region including the corner portion. Further, two pixel sections 2A and 2B are arranged in the upper and lower direction such that the corner portions thereof are adjacent to each other. The corner portions of the pixel sections 2A and 2B are coupled to each other in an integrated manner. The region where the two corner portions are coupled to each other forms the voltage conversion section 14, and the voltage conversion section 14 is shared by the two pixel sections 2A and 2B.

In addition, the two-pixel section 2 (2A, 2B) has a structure of pixel sections in which the two pixel sections (photodiodes 12, 12) sharing the voltage conversion section 14 are arranged in the upper and lower direction (or the left and right direction) to be adjacent to each other. Since transfer gate electrodes 16 are facing each other, even if the pixel sections 2A, 2B have different reading periods (different reading timings), it is necessary, as shown in Portion (b) of FIG. 4, to have an increased impurity concentration of each of the p-type semiconductor layers 18 and 19 that are provided between the adjacent transfer gate electrodes 16, compared to the exemplary structure of the pixel section (or pixel sections) shown in FIG. 1 and FIG. 5 to be described later.

In Portion (a) of FIG. 4, the description has been given regarding the case in which the voltage conversion section 14 is shared by adjacent pixel sections (photodiodes 12, 12) that are arranged in the upper and lower direction. However, the present invention is not limited to this. Alternatively, as shown in FIG. 5, the voltage conversion section 14 may be shared by two adjacent pixel sections (photodiodes 12, 12) that are arranged in a slanted manner (e.g., in a direction from the upper right corner to the bottom left corner or in a direction from the upper left corner to the bottom right corner). Also in this case, as an example of an application of the present invention, end portions of the device separation insulating film 17 only have to be located inwardly below respective transfer gate electrodes 16. In the exemplary structure of pixel sections in which two pixel sections (photodiodes 12, 12) sharing the voltage conversion section 14 are arranged in a slanted manner, since the transfer gate electrodes 16 are not adjacent to each other or they do not face each other, it is necessary to sufficiently secure a separation width of each of the surface diffusion layer 18 and the circumference diffusion layer 19 between the transfer gate electrode 16 and a neighboring adjacent photodiode 12, as in the case of the exemplary structure of the pixel section shown in FIG. 1.

In addition, a plurality of two-pixel sections shown in Portion (a) of FIG. 4 and FIG. 5 is arranged in arrays in the upper and lower direction and the left and right direction in an image capturing region of a solid-state image capturing device. It is preferable that a separation width of each of the surface diffusion layer 18 and the circumference diffusion layer 19 between the transfer gate electrodes 16 of adjacent charge transfer transistors is greater than or equal to 0.1 μm to less than or equal to 0.3 μm.

Embodiment 3

Embodiment 3 describes an example of the present invention applied to a case in which a single voltage conversion section 14 is shared by each of the two sets of adjacent pixel sections, for which signals are read during different reading periods (with different reading timings) A and B, and the transfer gate electrode 16 is formed continuously over each of the two sets of adjacent pixel sections, for each of which signals are read during the same reading period (with the same reading timing) A (or B). This shows a case in which two sets of adjacent pixel sections (photodiodes 12, 12) shown in Portion (a) of FIG. 4 described above are arranged in such a manner that the transfer gate electrodes 16 are adjacent to each other, respectively, and the transfer gate electrodes 16 provided on the upper side are connected to each other and the transfer gate electrodes 16 provided on the lower side are connected to each other.

Portion (a) of FIG. 6 is a top view showing an exemplary structure of pixel sections 3A 3B, 3A', 3B' in a solid-state image capturing device according to Embodiment 3 of the present invention. Portion (b) of FIG. 6 is a longitudinal cross-sectional view of a portion cut by line C-C' in Portion (a) of FIG. 6.

As shown in Portion (a) of FIG. 6 and Portion (b) of FIG. 6, the pixel section 3A (or 3B, 3A', 3B') in the solid-state image capturing device according to Embodiment 3 includes: a photodiode 12 that functions as a light receiving device; and a charge transfer transistor that functions as a charge transfer device. A corner portion of the pixel section 3A that has a square shape or rectangular shape in a plane view remains such that a transfer gate electrode 16 that functions as a control electrode of the charge transfer transistor is provided in a slanted manner on adjacent sides at the corner portion of the pixel section 3A that has a square shape or rectangular shape in a plane view. The photodiode 12 is provided in the pixel section 3A except at the corner portion and the region of the transfer gate electrode 16. A voltage conversion section 14 is provided at a region including the corner portion Further, the four pixel sections 3A, 3B, 3A' 3B' are arranged in such a manner that the corner portions thereof are adjacent to each other. The corner portions of the two pixel sections 3A, 3B among the four pixel sections 3A, 3B, 3A', 3B' are coupled to the corner portions of the other two pixel sections 3A', 3B', respectively, in an integrated manner. One region and the other region where the corner portions of the two pixel sections are coupled to each other and the corner portions of the other two pixel sections are coupled to each other, respectively, form one voltage conversion section 14 and the other voltage conversion section 14, respectively. The two pixel sections 3A, 3B share the one voltage conversion section 14 provided on the left side, and the other two pixel sections 3A', 3B' share the other voltage conversion section 14 provided on the right side. The device separation insulating films 17 are provided between the one voltage conversion section 14 and the other voltage conversion section 14.

In addition, the pixel sections 3 (3A, 3A') transfer charge from two photodiodes 12, 12 to the two voltage conversion sections 14 during the same reading period (with the same reading timing) A via different paths below the one coupled transfer gate electrode 16. Since one transfer gate electrode 16 is formed continuously over the two pixel sections 3A, 3A' or 3B, 3B' that are provided in the left and right direction, device separation cannot be made by the impurity diffusion layer (surface diffusion layer 18), if the device separation insulating film 17 is located inwardly below the transfer gate electrode 16. When the transfer gate electrode 16 continuously formed is divided, the device separation can be made using the method described above. However, when an area for providing a contact section on the transfer gate electrode 16 is not sufficiently secured or the like, it is sometimes not possible to separate the transfer gate electrodes 16 from each other. In such a case, a diffusion layer having a high impurity concentration may be formed prior to the formation of the transfer gate electrodes 16. However, in this case, there is a concern of diffusing the impurity when the gate oxide film is formed, thus resulting in an increased impurity concentration of the semiconductor layer 11 below the transfer gate electrode 16, leading to the deterioration in the charge transfer. In the case where such a deterioration in the charge transfer occurs, an impurity is implanted subsequent to the formation of the transfer gate electrodes 16 to penetrate the transfer gate electrode 16 in order to form the impurity diffusion layer (surface diffusion layer 18) for device separation.

In the exemplary structure of the pixel sections shown in FIG. 6, in the case where charge is transferred from the photodiode 12 to the voltage conversion section 14, when a transfer voltage is applied to the transfer gate electrode 16, there is a concern of decreasing the potential at the surface diffusion layer 18, thus resulting in the flow of charge into the voltage conversion section 14 of a neighboring adjacent pixel section. Therefore, when charge is transferred from the photodiode 12 to the voltage conversion section 14, it is necessary to set the potential at the p-type semiconductor layer 11 present between the photodiode 12 and the voltage conversion section 14 below the transfer gate electrode 16 lower than the potential at the surface diffusion layer 18.

As described above, according to Embodiments 1 to 3, pixel sections include a plurality of photodiodes 12 arranged in two dimensional arrays, voltage conversion sections 14 and a plurality of transistors. In such pixel sections, device separation is made by: device separation insulating films 17; surface diffusion layers 18 that are each made from a semiconductor layer having an opposite polarity to the photodiode 12; and circumference diffusion layers 19 that are each made of a semiconductor layer having the same polarity as the surface diffusion layer 18 and that is formed at a location deeper than the bottom surface of the device separating insulating film 17 to cover the end face of the device separating insulating film 17. The end position G of the device separation insulating film 17 that is present below the transfer gate electrode 16 is located inwardly below the transfer gate electrode 16 with respect to the end face 12a of the photodiode 12 from the end face 12 of the photodiode 12. As such, it is possible to prevent the flow of dark current from the device separation insulating film 17 into the photodiode 12, without causing the deterioration in the charge transfer by the transfer gate electrode 16 from the photodiode 12 to the voltage conversion section 14. As a result, it is possible to further suppress noise.

Embodiment 4

In Embodiments 1 to 3, the device separation insulating film 17 for separating photodiodes 12 from each other and transistors from each other is formed that is below the transfer gate electrode 16 of the charge transfer transistor and that is on the opposite side with respect to the photodiode 12, the end position G of the device separation insulating film 17 is located inwardly below the transfer gate electrode 16 with respect to the photodiode 12 from the end face 12a of the photodiode 12, and the surface diffusion layer 18 and the circumference diffusion layer 19 are formed around the periphery of the photodiode 12, starting from the end position G of the device separation insulating film 17 below the transfer gate electrode 16. Further, the end portion 17a of the device separation insulating film 17 only has to be located within the region G2 where the electric field H to be generated between the photodiode 12 side and the voltage conversion section 14 side below the transfer gate electrode 16 of the charge transfer transistor is generated in a direction from the photodiode 12 side to the voltage conversion section 14 side.

In Embodiment 4, the objective of the present invention of further reducing noise by suppressing the flow of charge generated from the device separation insulating film 17 into the photodiode 12 side and also by suppressing the accumulation of the charge at the photodiode 12 is more significantly achieved, compared to the case in Reference 2 of the conventional technique even if the objective of the present invention in Embodiment 4 is not achieved as much as the cases in Embodiments 1 to 3. In order to achieve the objective of the present invention, a device separation section for separating adjacent photodiodes 12 from each other, adjacent transistors from each other, and a photodiode 12 and a transistor in Embodiment 4 includes: a device separation insulating film 17; and an implantation separation semiconductor layer 18 having an opposite conductive type to each of the photodiode 12 and the voltage conversion section 14 while the end portions of the device separation insulating film 17 and the end portions of the semiconductor layer 18 are overlapped with each other to surround the four sides of a photodiode 12 in a square or rectangular shape in a plane view. The device separation insulating film 17 extends along the two adjacent sides of the outer-periphery of the voltage conversion section 14 in a triangular shape among the three sides thereof shown in FIG. 1, and the device separation insulating film 17 also extends beyond portions below the transfer gate electrode 16 that is a control electrode of the charge transfer transistor functioning as a charge transfer section and protrudes along the two sides of the periphery of the photodiode 12. More specifically, the device separation insulating film 17 protrudes beyond a portion below the end face 16a of the transfer gate electrode 16 on the photodiode 12 side, and the length of the protruded portion of the device separation insulating film 17 is much shorter than the entire length of one side of the photodiode 12. Further, when the end portion 17a of the device separation insulating film 17 is located directly under the position of the end face 16a of the transfer gate electrode 16 on the photodiode 12 side or when the end portion 17a of the device separation insulating film 17 is located inwardly below the transfer gate electrode 16 with respect to the photodiode 12 from the end face 16a of the transfer gate electrode 16 on the photodiode 12 side, the device separation insulating film 17 may protrude beyond the end face 16a of the transfer gate electrode 16 on the photodiode 12 side, in view of a process margin (including an alignment margin and a formation margin), and the length of the protruded portion of the device separation insulating film 17 only has to be shorter than the length designated in view of the process margin (e.g., width of transfer gate electrode 16).

As a specific example, Embodiment 4 has described the case in which when the position of the end portion 17a of the device separation insulating film 17 that faces the end face 12a of the photodiode 12 matches the position of the end face 16a of the transfer gate electrode 16 on the photodiode 12 side in a plane view or the position of the end portion 17a of the device separation insulating film 17 that faces the end face 12a of the photodiode 12 is located inwardly below the transfer gate electrode 16 with respect to the photodiode 12 from the end face 16a of the transfer gate electrode 16 on the photodiode 12 side, an protruded portion of the device separation insulating film 17 has a protruded length designated in view of a process margin or the protruded portion of the device separation insulating film 17 protrudes shorter than the protruded length. However, the present invention is not limited to this. Alternatively, a protruded length of the protruded portion may be a cut length of the transfer gate electrode that corresponds to one side of the photodiode 12 (the cut length refers to a length of each of the ends of the transfer gate electrode 16 having a strip shape, which is provided over a corner portion of a rectangle in a plane view, is cut in a direction along a corresponding side of the rectangle in a plane view) or shorter than the cut length. Still alternatively, a protruded length of the protruded portion may be the width of the transfer gate electrode 16 or shorter than the width thereof. Further alternatively, a protruded length of the protruded portion may be the width of the device separation insulating film 17 or shorter than the width thereof. Further, in the case of Embodiment 4, overlapping portions of the end face 16a of the transfer gate electrode 16 on the photodiode 12 side, and the device separation insulating film 17 and the device separation semiconductor layer 18 are obliquely-crossed, and the end portions 17a of the device separation insulating film 17 may be located toward the transfer gate electrode 16 side with respect to the positions of the respective end faces 16a of the transfer gate electrode 16 on the photodiode 12 side.

Embodiment 5

Embodiment 5 describes an electronic information device having, for example, a digital camera (e.g., digital video camera, digital still camera), an image input camera (e.g., monitoring camera, door intercom camera, car-mounted camera, camera for television telephone and camera for cell phone), and an image input device (e.g., scanner, facsimile and cell phone device equipped with camera) using a solid-state image capturing apparatus including a solid-state image capturing device having a plurality of pixel sections according to any one of Embodiments 1 to 3 arranged in an image capturing region in two dimensional arrays for an image capturing section thereof.

FIG. 12 is a block diagram showing an exemplary schematic structure of an electronic information device according to Embodiment 5 of the present invention using a solid-state image capturing apparatus including a solid-state image capturing device having a plurality of pixel sections according to any one of Embodiments 1 to 3 for an image capturing section thereof.

In FIG. 12, the electronic information device 90 according to Embodiment 5 includes at least one of the following: a solid-state image capturing apparatus 91 for obtaining image data (e.g., color image signal) obtained by performing signal processes on an image capturing signal from a solid-state image capturing device according to any one of Embodiments 1 to 3; a memory section 92 (e.g., recording media) for data-recording high-quality image data after a predetermined signal process on the high-quality image data from the solid-state image capturing apparatus 91 for recording; a display section 93 (e.g., liquid crystal display device) for displaying image data on a display screen (e.g., liquid crystal display screen) after a predetermined signal process is performed on the image data from the solid-state image capturing apparatus 91 for display: a communication section 94 (e.g., transmitting and receiving device) for communicating image data after a predetermined signal process is performed on the image data from the solid-state image capturing apparatus 91 for communication; and an image output section 95 for printing (typing out) and outputting (printing out) image data from the solid-state image capturing apparatus 91.

Embodiment 2 has described the case in which two pixel sections 2A, 2B share a single voltage conversion section 14. Herein, a connection relationship between four pixel sections 1 according to Embodiment 1 and a plurality of transistors when the four pixel sections 1 share, for example, a single voltage conversion section 14 will be described with reference to FIG. 7 and FIG. 8.

FIG. 7 is a top view showing an exemplary structure of pixels in a solid-state image capturing device according to Embodiment 5 of the present invention.

As shown in FIG. 7, each pixel section in the four-pixel section according to Embodiment 5 includes: a photodiode (PD) 12 that functions as a light receiving device; and a charge transfer transistor T1 that functions as a charge transfer device. A corner portion of the pixel section 2A that has a square shape or rectangular shape in a plane view remains such that a transfer gate electrode 16 that functions as a control electrode of the charge transfer transistor T1 is provided in a slanted manner on adjacent sides (at the corner portion of the pixel section 2A that has a square shape or rectangular shape in a plane view. The photodiode (PD) 12 is provided in the pixel section 2A except at the corner portion and the region of the transfer gate electrode 16. Four pixel sections are arranged in such a manner that the corner portions thereof are adjacent to each other. The corner portions of the four pixel sections are coupled to each other in an integrated manner. The region where the corner portions of the four pixel sections are coupled to each other forms one voltage conversion section 14. The four pixel sections share the one voltage conversion section 14.

FIG. 8 is a circuit diagram showing an exemplary essential structure of a solid-state image capturing device according to the present invention used for an electronic information device according to Embodiment 5 of the present invention when four pixel sections share a single voltage conversion section.

In a four-pixel section in the solid-state image capturing device used for the electronic information device according to Embodiment 5 in FIG. 8, four pixel sections (a plurality of pixel sections; herein four pixel sections) are used as one unit, and each four-pixel section includes: four photodiodes PD-1 to PD-4 as photodiodes 12 which are adjacent to each other in a vertical direction and correspond to the respective four pixel sections; and transfer transistors T1-1 to T1-4 functioning as transfer sections including transfer gate electrode 16 capable of sequentially transferring signal charge from the photodiodes PD-1 to PD-4 to the voltage conversion section 14 functioning as a charge detection section. An end of each of the transfer transistors T1-1 to T1-4 which is not connected to each of the respective photodiodes (PD) 12 is commonly connected to the voltage conversion section 14. In addition, the four-pixel section further includes: a reset transistor T3 functioning as a reset section for resetting potential at the voltage conversion section 14 to a power supply voltage (drain voltage) Vdd; an amplification transistor T2 functioning as an amplification section for amplifying the potential (signal) from the voltage conversion section 14; and a selection transistor T4 functioning as a selection section for selectively reading an output from the amplification transistor T2 to a reading signal line SIG. A plurality of four-pixel sections is arranged in a matrix in the four-transistor type image sensor according to Embodiment 5 so as to form an image capturing region.

Transfer gate electrodes 16 of the transfer transistors T1-1 to T1-4 are connected to transfer transistor drive lines TX1 to TX4, respectively. The amplification transistor T2 is connected between the power supply voltage Vdd and the selection transistor T4. A gate electrode of the transfer transistor T2 is connected to the charge detection section (floating diffusion FD) (i.e., voltage conversion section 14). The reset transistor T3 is connected between the power supply voltage (drain voltage) Vdd and the voltage conversion section 14. A gate electrode of the reset transistor T3 is connected to a reset transistor drive line RST. The selection transistor T4 is connected between the amplification transistor T2 and the reading signal line SIG. A gate electrode of the selection transistor T4 is connected to a selection transistor drive line SEL.

The reading signal line SIG is connected to a ground voltage end via a load transistor T5. A plurality of four-pixel sections is arranged in a matrix, and a plurality of reading signal lines SIG is provided in one direction (horizontal direction).

With the structure described above, first, the reset transistor T3 is placed on an on-state, and the potential at the voltage conversion section 14 is reset to the power supply voltage (drain voltage) Vdd.

Then, the transfer transistor T1-1 located at the top is placed on an on-state, and signal charge is transferred from the photodiode (photoelectric conversion section) PD-1 to the charge detection section (floating diffusion FD) (i.e., voltage conversion section 14).

The potential at the voltage conversion section 14 resulting from the difference between before and after the operation of transferring signal charge is amplified by the amplification transistor T2. Then, the amplified potential is read to the reading signal line SIG via the selection transistor T4.

Similarly, an operation of transferring signal charge to the voltage conversion section 14, an operation of amplifying the potential at the voltage conversion section 14 resulting from the difference between before and after the operation of transferring signal charge and an operation of reading the amplified potential (signal) to the reading signal line SIG are subsequently performed for each of the photodiode PD-2 located second from the top, the photodiode PD-3 located third from the top and the photodiode PD-4 located fourth from the top.

Next, the signal read to the reading signal line SIG is received by the load transistor T5 connected to the end of the reading signal line SIG so as to output a signal Vout.

The following description has not been particularly made in Embodiments 1 to 5; yet, the voltage conversion section 14 is in contact with the device separation insulating film 17. However, even if unwanted current flows from the device separation insulating film 17 into the voltage conversion section 14, no adverse effect is exerted on the voltage conversion section 14 by the device separation insulating film 17 since the voltage conversion section 14 does not accumulate charge, and it is reset to a predetermined potential by the reset transistor prior to the charge transfer from the photodiode 12 to the voltage conversion section 14.

In addition, the following description has not been particularly made in Embodiments 1 to 5; yet, in a solid-state image capturing device in which a plurality of light receiving devices for each converting incident light to signal charge is arranged in two dimensions, the signal charge obtained by a conversion at a light receiving device is transferred to a voltage conversion section by a charge transfer device, and a signal amplified in accordance with a signal voltage obtained by a conversion at the voltage conversion section is read, wherein a device separation insulating film and a device separation semiconductor layer may be provided for a device separation section for separating adjacent devices from each other, end portions of the device separation insulating film and end portions of the device separation semiconductor layer may be provided to overlap each other in order to surround two sides of an outer-periphery of the voltage conversion section and also to surround a channel section of the charge transfer device and the light receiving device, and an end portion of the device separation insulating film facing an end face of the light receiving device may be arranged inwardly below a control electrode with respect to an end face of the control electrode on the light receiving device side or an end portion of the device separation insulating film facing an end face of the light receiving device may be arranged as an protruded portion that extends beyond a portion below the end face of the control electrode on the light receiving device side and protrudes along a side of a periphery of the light receiving device. Alternatively, an entire or partial device separation insulating film in its width direction, which extends along the two sides of the outer-periphery of the voltage conversion section, may be provided under both ends of a control electrode of the charge transfer device or an entire or partial device separation insulating film in its width direction may be provided as an protruded portion that extends along the two sides of the outer-periphery of the voltage conversion section, extends beyond portions below the ends at the control electrode and protrudes along the periphery of the light receiving device. As such, without complicating the steps and without making the formation of the transfer gate electrode difficult as required in the conventional technique, the objective of the present invention of further reducing noise by suppressing the flow of charge generated from the device separation insulating film into the photodiode and also by suppressing the accumulation of the charge at the photodiode is achieved.

As described above, the present invention is exemplified by the use of its preferred Embodiments 1 to 5. However, the present invention should not be interpreted solely based on Embodiments 1 to 5 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 5 of the present invention. Furthermore, it is understood that any patent, any patent application and any references cited in the present specification should be incorporated by reference in the present specification in the same manner as the contents are specifically described therein.

INDUSTRIAL APPLICABILITY

According to the present invention, in a field of: a solid-state image capturing device (e.g., MOS image sensor) for transferring, to a voltage conversion section, signal charge obtained by a photoelectrical conversion at a photodiode that functions as a light receiving section for receiving light of a subject and sequentially reading a signal corresponding to a voltage obtained by a conversion at the voltage conversion section; and an electronic information device (e.g., digital camera, cell phone device equipped with camera and the like) using the solid-state image capturing device for an image capturing section thereof, an entire or partial device separation insulating film in its width direction, which extends along the two sides of the outer-periphery of the voltage conversion section, is provided under both ends of a control electrode of the charge transfer device or an entire or partial device separation insulating film in its width direction is provided as an protruded portion that extends along the two sides of the outer-periphery of the voltage conversion section, extends beyond portions below the ends at the control electrode and protrudes along the periphery of the light receiving device. As a result, without complicating the steps and without making the formation of the transfer gate electrode difficult as happens conventionally, it is possible to significantly prevent the flow of unwanted charge generated at the interface between the device separation insulating film and the silicon substrate into the light receiving device side, compared to the conventional structures in which the device separation insulating film is provided around the periphery of the light receiving device.

Further, even if unwanted charge is generated at the device separation insulating film that is present below the control electrode of the charge transfer transistor, it is possible to reduce noise since the unwanted charge is less likely to be accumulated at the light receiving device, as long as the direction of the electric field is toward the voltage conversion section side. Further, if a predetermined amount of distance between the end face of the control electrode on the light receiving device side and the device separation insulating film is secured, it is possible to provide a structure in which the light receiving device and the control electrode are overlapped with each other in a plane view, and thus it is possible to prevent the dark current and to improve the efficiency in the charge transfer. In addition, it is possible to enlarge the region size of the light receiving device and to increase a saturation charge amount. Further, also in the structure in which a single voltage conversion section is shared by pixel sections, it is possible to reduce to the greatest extent the amount of surfaces of the light receiving device and the device separation insulating film that face each other by reducing the surface-area size of the device separation insulating film that is present below the control electrode. As a result, it is possible to further suppress noise.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing device in which a plurality of light receiving devices for each converting incident light to signal charge is arranged in two dimensions, the signal charge obtained by a conversion at a light receiving device is transferred to a voltage conversion section by a charge transfer device, and a signal amplified in accordance with a signal voltage obtained by a conversion at the voltage conversion section is read, wherein
a device separation insulating film and a device separation semiconductor layer are provided for a device separation section for separating adjacent devices from each other,
end portions of the device separation insulating film and end portions of the device separation semiconductor layer are provided to overlap each other in order to surround two sides of an outer-periphery of the voltage conversion section and also to surround a channel section of the charge transfer device and the light receiving device, wherein a gate insulation film is formed below a control electrode of the charge transfer device and above each of: the light receiving device, end portions of the device separation insulating film and end portions of the device separation semiconductor layer,
an end portion of the device separation insulating film facing an end face of the light receiving device is arranged inwardly below the control electrode with respect to an end face of the control electrode on the light receiving device side or an end portion of the device separation insulating film facing an end face of the light receiving device is arranged as a protruded portion that extends beyond a portion below the end face of the control electrode on the light receiving device side and protrudes along a side of a periphery of the light receiving device, and
an end face of the device separation insulating film extends perpendicularly from the side of the periphery light receiving device and extends perpendicularly from a side of a periphery of an adjacent light receiving device, wherein the end face of the device separating insulating film interfaces with a face of the device separation semiconductor layer.

2. A solid-state image capturing device according to claim 1, wherein a pixel section includes:
the light receiving device and the charge transfer device,
a corner portion of the pixel section that has a square shape or rectangular shape in a plane view remains such that the control electrode of the charge transfer device is provided in a slanted manner on adjacent sides at the corner portion of the pixel section that has a square shape or rectangular shape in a plane view,
the light receiving device is provided in the pixel section except at the corner portion and a region of the control electrode, and
the voltage conversion section is provided at the corner portion or a region including the corner portion.

3. A solid-state image capturing device according to claim 1, wherein the end portion of the device separation insulating film is at least located within a region where the electric field generated below the control electrode is generated in a direction from a portion below the control electrode to the voltage conversion section.

4. A solid-sate image capturing device according to claim 3, wherein the device separation insulating film is formed to have a minimum size with maximum process utilization in view of a size of the device separation insulating film in the region.

5. A solid-state image capturing device according to claim 3, wherein the end portion of the device separation insulating film is at least located away from the end face of the light receiving device by a region where an electric field generated below the control electrode is generated in a direction from a portion below the control electrode to the light receiving device.

6. A solid-state image capturing device according to claim 1, wherein the end portion of the device separation insulating film is at least located away from the end face of the light receiving device by a region where an electric field generated below the control electrode is generated in a direction from a portion below the control electrode to the light receiving device.

7. A solid-state image capturing device according to claim 1, wherein when an end portion of the device separation insulating film facing an end face of the light receiving device is arranged as a protruded portion that extends beyond a portion below the end face of the control electrode on the light receiving device side, a protruded length of the protruded portion is a cut length of the control electrode that corresponds to a direction of one side of the light receiving device or shorter than the cut length.

8. A solid-state image capturing device according to claim 1, wherein when an end portion of the device separation insulating film facing an end face of the light receiving device is arranged as a protruded portion that extends beyond a portion below the end face of the control electrode on the light receiving device side, a protruded length of the protruded portion is a width of the control electrode or shorter than the width.

9. A solid-state image capturing device according to claim 1, wherein when an end portion of the device separation insulating film facing an end face of the light receiving device is arranged as a protruded portion that extends beyond a portion below the end face of the control electrode on the light receiving device side, a protruded length of the protruded portion is a width of the device separation insulating film or shorter than the width.

10. A solid-state image capturing device according to claim 1, wherein when an end portion of the device separation insulating film facing an end face of the light receiving device is arranged as a protruded portion that extends beyond a portion below the end face of the control electrode on the light receiving device side, and when a position of the end portion of the device separation insulating film that faces the end face of the light receiving device matches a position of the end face of the control electrode on the light receiving device side in a plane view or the position of the end portion of the device separation insulating film that faces the end face of the light receiving device is located inwardly below the control electrode with respect to the end face of the control electrode on the light receiving device side, the protruded portion has a protruded length designated in view of a process margin or the protruded portion of the device separation insulating film protrudes shorter than the protruded length.

11. A solid-state image capturing device according to claim 10, wherein overlapping portions of the end face of the control electrode on the light receiving device side, and the device separation insulating film and the device separation semiconductor layer are obliquely-crossed, and the end portions of the device separation insulating film is located toward the control electrode side with respect to the positions of the respective end faces of the control electrode on the light receiving device side.

12. A solid-state image capturing device according to claim 1, wherein the device separation semiconductor layer is provided while the end portions of the device separation semiconductor layer are overlapped with the end portions of the device separation insulating film to surround side surfaces and a bottom surface of the device separation insulating film.

13. A solid-state image capturing device according to claim 1, wherein the device separation insulating film protrudes from a portion below the end face of the control electrode of the light receiving side, and the device separation semiconductor layer is provided while the end portions of the device separation semiconductor layer are overlapped with the end portions of the device separation insulating film to surround side surfaces and a bottom surface of a portion of the device separation insulating film below the control electrode, the portion including the protruded portion.

14. A solid-state image capturing device according to claim 1, wherein a portion in which the end portions of the device separation semiconductor layer and the end portions of the device separation insulating film are overlapped with each other includes at least a region where the electric field generated below the control electrode is generated in a direction from a portion below the control electrode to the light receiving device.

15. A solid-state image capturing device according to claim 1, wherein the end portions of the device separation semiconductor layer are overlapped with the end portions of the device separation insulating film while a width of the device separation semiconductor layer is larger than a width of the device separation insulating film.

16. A solid-state image capturing device according to claim 1, wherein the device separation semiconductor layer includes:
a surface diffusion layer made from a semiconductor layer having an opposite conductive type to the light receiving device and the voltage conversion section; and
a circumference diffusion layer that is made from a semiconductor layer having the same conductive type as the surface diffusion layer and that surrounds side surfaces and a bottom surface of the surface diffusion layer.

17. A solid-state image capturing device according to claim 16, wherein a separation width of each of the surface diffusion layer and the circumferential diffusion layer between the control electrode of the charge transfer device and a neighboring adjacent light receiving device is set to greater than or equal to 0.1 µm to less than or equal to 0.5 µm.

18. A solid-state image capturing device according to claim 16, wherein a separation width of each of the surface diffusion layer and the circumferential diffusion layer between the control electrode of the charge transfer device and a neighboring adjacent light receiving device is set to greater than or equal to 0.1 µm to less than or equal to 0.3 µm.

19. A solid-state image capturing device according to claim 16, wherein an impurity for each of the surface diffusion layer and the circumference diffusion layer is implanted prior to the formation of the control electrode of the charge transfer device.

20. A solid-state image capturing device according to claim 16, wherein an impurity for the surface diffusion layer is implanted subsequent to the formation of the control electrode of the charge transfer device so as to penetrate the control electrode.

21. A solid-state image capturing device according to claim 16, wherein an impurity concentration of the surface diffusion layer is set higher than an impurity concentration of a semiconductor layer having the same conductive type provided below the control electrode of the charge transfer device.

22. A solid-state image capturing device according to claim 1, further comprising a signal reading circuit for reading a signal corresponding to a signal voltage, the signal voltage having been obtained by converting signal charge at the voltage conversion section, and the signal charge having been transferred from the light receiving device to the voltage conversion section.

23. A solid-state image capturing device according to claim 22, wherein the signal reading circuit is provided for each pixel section or the signal reading circuit is shared by a plurality of pixel sections.

24. A solid-state image capturing device according to claim 22, wherein among a reset transistor capable of resetting the voltage conversion section so as to have a predetermined voltage, an amplification transistor for outputting a signal corresponding to a signal voltage obtained by converting signal charge that has been transferred from the light receiving device to the voltage conversion section subsequent to the resetting, and a selection transistor for reading the output signal from the amplification transistor with a predetermined timing, the signal reading circuit includes at least the reset transistor and the amplification transistor.

25. A solid-state image capturing device according to claim 22, wherein the device separation section separates the light receiving device and the charge transfer device from component devices of the reading signal circuit, the light receiving device and the charge transfer device and the component device being adjacent to each other.

26. A solid-state image capturing device according to claim 1, wherein the light receiving device is a photodiode, and the control electrode of the charge transfer device is a transfer gate electrode of a charge transfer transistor.

27. A solid-state image capturing device according to claim 1, wherein the device separation section separates adjacent light receiving devices from each other, charge transfer devices from each other, and the light receiving device and the charge transfer device from each other.

28. A solid-state image capturing device according to claim 1, wherein the device separation insulating film is formed by the same method with the same material and at the same time as a device separation insulating film for separating devices that form a drive circuit provided in a peripheral drive circuit region, the drive circuit driving the signal reading circuit and the charge transfer device.

29. A solid-state image capturing device according to claim 1, wherein the device separation insulating film is different from a device separating insulating film for separating devices that separate devices that form a drive circuit provided in a peripheral circuit region, the device separation insulating film being formed exclusively for a pixel-section region to have a film thicker than the device separating insulating film for separating the devices that form the drive circuit, the drive circuit driving the signal reading circuit and the charge transfer device.

30. A solid-state image capturing device according to claim 1, wherein the device separating insulating film is an insulating film formed by LOCOS (Local Oxidation of Silicon) or STI (Shallow Trench Isolation).

31. A solid-state image capturing device according to claim 1, wherein an impurity for a semiconductor layer forming the light receiving device is implanted prior to the formation of the control electrode of the charge transfer device.

32. A solid-state image capturing device according to claim 31, wherein the light receiving device and the control electrode of the charge transfer device are overlapped with each other in a plane view to have an overlapping portion.

33. A solid-state image capturing device according to claim 1, wherein an impurity for a semiconductor layer forming the light receiving device is implanted subsequent to the formation of the control electrode of the charge transfer device.

34. A solid-state image capturing device according to claim 33, wherein the light receiving device is formed resulting from the self-alignment with respect to the control electrode of the charge transfer device.

35. A solid-state image capturing device according to claim 1, wherein the end portion of the device separation insulating film is at least located within a region where an electric field generated below the control electrode is generated in a direction from a portion below the end face of the control electrode on the light receiving device side to the voltage conversion section.

36. A solid-state image capturing device according to claim 35, wherein a maximum potential at the electric field generated below the control electrode is located directly under the end face of the control electrode on the light receiving device side.

37. An electronic information device using a solid-state image capturing device according to claim 1 for an image capturing section thereof.

38. A solid-state image capturing device in which a plurality of light receiving devices for each converting incident light to signal charge is arranged in two dimensions, the signal charge obtained by a conversion at a light receiving device is transferred to a voltage conversion section by a charge transfer device, and a signal amplified in accordance with a signal voltage obtained by a conversion at the voltage conversion section is read, wherein a device separation insulating film and a device separation semiconductor layer are provided for a device separation section for separating adjacent devices from each other, end portions of the device separation insulating film and end portions of the device separation semiconductor layer are provided to overlap each other in order to surround two sides of an outer-periphery of the voltage conversion section and also to surround a channel section of the charge transfer device and the light receiving device, wherein a gate insulation film is formed below a control electrode of the charge transfer device and above each of: the light receiving device, end portions of the device separation insulating film and end portions of the device separation semiconductor layer, an entire or partial device separation insulating film in its width direction, which extends along the two sides of the outer-periphery of the voltage conversion section, is provided under both ends of the control electrode of the charge transfer device or an entire or partial device separation insulating film in its width direction is provided as a protruded portion that extends along the two sides of the outer-periphery of the voltage conversion section, extends beyond portions below the ends at the control electrode and protrudes along the periphery of the light receiving device, and an end face of the device separation insulating film extends perpendicularly from the side of the periphery light receiving device and extends perpendicularly from a side of a periphery of an adjacent light receiving device, wherein the end face of the device separation insulating film interfaces with a face of the device separation semiconductor layer.

39. A solid-state image capturing device according to claim 38, wherein both ends of the control electrode of the charge transfer device are provided over an entire or partial width of each of the device separation insulating film and the device separation semiconductor layer.

40. A solid-state image capturing device according to claim 38, wherein a pixel section includes:
the light receiving device and the charge transfer device,
a corner portion of the pixel section that has a square shape or rectangular shape in a plane view remains such that the control electrode of the charge transfer device is provided in a slanted manner on adjacent sides at the corner portion of the pixel section that has a square shape or rectangular shape in a plane view,
the light receiving device is provided in the pixel section except at the corner portion and a region of the control electrode, and
the voltage conversion section is provided at the corner portion or a region including the corner portion.

41. A solid-state image capturing device according to claim 38, wherein the end portion of the device separation insulating film is at least located within a region where the electric field generated below the control electrode is generated in a direction from a portion below the control electrode to the voltage conversion section.

42. A solid-state image capturing device according to claim 41, wherein the device separation insulating film is formed to have a minimum size with maximum process utilization in view of a size of the device separation insulating film in the region.

43. A solid-state image capturing device according to claim 41, wherein the end portion of the device separation insulating film is at least located away from the end face of the light receiving device by a region where an electric field generated below the control electrode is generated in a direction from a portion below the control electrode to the light receiving device.

44. A solid-state image capturing device according to claim 38, wherein the end portion of the device separation insulating film is at least located away from the end face of the light receiving device by a region where an electric field generated below the control electrode is generated in a direction from a portion below the control electrode to the light receiving device.

45. A solid-sate image capturing device according to claim 38, wherein when an entire or partial device separation insulating film in its width direction is provided as a protruded portion that extends along the two sides of the outer-periphery of the voltage conversion section, a protruded length of the protruded portion is a cut length of the control electrode that corresponds to a direction of one side of the light receiving device or shorter than the cut length.

46. A solid-state image capturing device according to claim 38, wherein when an entire or partial device separation insulating film in its width direction is provided as a protruded portion that extends along the two sides of the outer-periphery of the voltage conversion section, a protruded length of the protruded portion is a width of the control electrode or shorter than the width.

47. A solid-state image capturing device according to claim 38, wherein when an entire or partial device separation insulating film in its width direction is provided as a protruded portion that extend along the two sides of the outer-periphery of the voltage conversion section, a protruded length of the protruded portion is a width of the device separation insulating film or shorter than the width.

48. A solid-state image capturing device according to claim 38, wherein when a position of an end portion of the device separation insulating film that faces the end face of the light receiving device matches a position of the end face of the control electrode on the light receiving side in a plane view or the position of the end portion of the device separation insulating film that faces the end face of the light receiving device is located inwardly below the control electrode with respect to the end face of the control electrode on the light receiving device side, the protruded portion has a protruded length designated in view of a process margin or the protruded portion of the device separation insulating film protrudes shorter than the protruded length.

49. A solid-state image capturing device according to claim 48, wherein overlapping portions of the end face of the control electrode on the light receiving device side, and the device separation insulating film and the device separation semiconductor layer are obliquely-crossed, and the end portions of the device separation insulating film is located toward the control electrode side with respect to the positions of the respective end faces of the control electrode on the light receiving device side.

50. A solid-state image capturing device according to claim 38, wherein the device separation semiconductor layer is provided while the end portions of the device separation semiconductor layer are overlapped with the end portions of the device separation insulating film to surround side surfaces and a bottom surface of the device separation insulating film.

51. A solid-state image capturing device according to claim 38, wherein the device separation insulating film protrudes from a portion below the end face of the control electrode of the light receiving side, and the device separation semiconductor layer is provided while the end portions of the device separation semiconductor layer are overlapped with the end portions of the device separation insulating film to surround side surfaces and a bottom surface of a portion of the device separation insulating film below the control electrode, the portion including the protruded portion.

52. A solid-state image capturing device according to claim 38, wherein a portion in which the end portions of the device separation semiconductor layer and the end portions of the device separation insulating film are overlapped with each other includes at least a region where the electric field generated below the control electrode is generated in a direction from a portion below the control electrode to the light receiving device.

53. A solid-state image capturing device according to claim 38, wherein the end portions of the device separation semiconductor layer are overlapped with the end portions of the device separation insulating film while a width of the device separation semiconductor layer is larger than a width of the device separation insulating film.

54. A solid-state image capturing device according to claim 38, wherein the device separation semiconductor layer includes:
a surface diffusion layer made from a semiconductor layer having an opposite conductive type to the light receiving device and the voltage conversion section; and
a circumference diffusion layer that is made from a semiconductor layer having the same conductive type as the surface diffusion layer and that surrounds side surfaces and a bottom surface of the surface diffusion layer.

55. A solid-state image capturing device according to claim 54, wherein a separation width of each of the surface diffusion layer and the circumferential diffusion layer between the control electrode of the charge transfer device and a neigh- 56. A solid-state image capturing device according to claim 54, wherein a separation width of each of the surface diffusion layer and the circumferential diffusion layer between the control electrode of the charge transfer device and a neighboring adjacent light receiving device is set to greater than or equal to 0.1 μm to less than or equal to 0.3 μm.

57. A solid-state image capturing device according to claim 54, wherein an impurity for each of the surface diffusion layer and the circumference diffusion layer is implanted prior to the formation of the control electrode of the charge transfer device.

58. A solid-state image capturing device according to claim 54, wherein an impurity for the surface diffusion layer is implanted subsequent to the formation of the control electrode of the charge transfer device so as to penetrate the control electrode.

59. A solid-state image capturing device according to claim 54, wherein an impurity concentration of the surface diffusion layer is set higher than an impurity concentration of a semiconductor layer having the same conductive type provided below the control electrode of the charge transfer device.

60. A solid-state image capturing device according to claim 38, further comprising a signal reading circuit for reading a signal corresponding to a signal voltage, the signal voltage having been obtained by converting signal charge at the voltage conversion section, and the signal charge having been transferred from the light receiving device to the voltage conversion section.

61. A solid-state image capturing device according to claim 60, wherein the signal reading circuit is provided for each pixel section or the signal reading circuit is shared by a plurality of pixel sections.

62. A solid-state image capturing device according to claim 60, wherein among a reset transistor capable of resetting the voltage conversion section so as to have a predetermined voltage, an amplification transistor for outputting a signal corresponding to a signal voltage obtained by converting signal charge that has been transferred from the light receiving device to the voltage conversion section subsequent to the resetting, and a selection transistor for reading the output signal from the amplification transistor with a predetermined timing, the signal reading circuit includes at least the reset transistor and the amplification transistor.

63. A solid-state image capturing device according to claim 60, wherein the device separation section separates the light receiving device and the charge transfer device from component devices of the reading signal circuit, the light receiving device and the charge transfer device and the component device being adjacent to each other.

64. A solid-state image capturing device according to claim 38, wherein the light receiving device is a photodiode, and the control electrode of the charge transfer device is a transfer gate electrode of a charge transfer transistor.

65. A solid-state image capturing device according to claim 38, wherein the device separation section separates adjacent light receiving devices from each other, charge transfer devices from each other, and the light receiving device and the charge transfer device from each other.

66. A solid-state image capturing device according to claim 38, wherein the device separation insulating film is formed by the same method with the same material and at the same time as a device separation insulating film for separating devices that form a drive circuit provided in a peripheral drive circuit region, the drive circuit driving the signal reading circuit and the charge transfer device.

67. A solid-state image capturing device according to claim 38, wherein the device separation insulating film is different from a device separating insulating film for separating devices that separate devices that form a drive circuit provided in a peripheral circuit region, the device separation insulating film being formed exclusively for a pixel-section region to have a film thicker than the device separating insulating film for separating the devices that form the drive circuit, the drive circuit driving the signal reading circuit and the charge transfer device.

68. A solid-state image capturing device according to claim 38, wherein the device separating insulating film is an insulating film formed by LOCOS (Local Oxidation of Silicon) or STI (Shallow Trench Isolation).

69. A solid-state image capturing device according to claim 38, wherein an impurity for a semiconductor layer forming the light receiving device is implanted prior to the formation of the control electrode of the charge transfer device.

70. A solid-state image capturing device according to claim 69, wherein the light receiving device and the control electrode of the charge transfer device are overlapped with each other in a plane view to have an overlapping portion.

71. A solid-state image capturing device according to claim 38, wherein an impurity for a semiconductor layer forming the light receiving device is implanted subsequent to the formation of the control electrode of the charge transfer device.

72. A solid-state image capturing device according to claim 71, wherein the light receiving device is formed resulting from the self-alignment with respect to the control electrode of the charge transfer device.

73. A solid-state image capturing device according to claim 38, wherein the end portion of the device separation insulating film is at least located within a region where an electric field generated below the control electrode is generated in a direction from a portion below the end face of the control electrode on the light receiving device side to the voltage conversion section.

74. A solid-state image capturing device according to claim 73, wherein a maximum potential at the electric field generated below the control electrode is located directly under the end face of the control electrode on the light receiving device side.

75. An electronic information device using a solid-state image capturing device according to claim 38 for an image capturing section thereof.

* * * * *